(12) United States Patent
Inoue et al.

(10) Patent No.: US 6,407,442 B2
(45) Date of Patent: *Jun. 18, 2002

(54) SEMICONDUCTOR DEVICE, AND OPERATING DEVICE, SIGNAL CONVERTER, AND SIGNAL PROCESSING SYSTEM USING THE SAME SEMICONDUCTOR DEVICE

(75) Inventors: Shunsuke Inoue, Yokohama; Mamoru Miyawaki, Isehara; Tetsunobu Kochi, Hiratsuka, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/548,545

(22) Filed: Oct. 26, 1995

(30) Foreign Application Priority Data

Oct. 28, 1994 (JP) .............................................. 6-265039

(51) Int. Cl.$^7$ .............................................. H01L 29/00
(52) U.S. Cl. ..................... 257/535; 257/347; 257/349; 257/532
(58) Field of Search ................................. 257/296, 311, 257/347, 348, 349, 532, 535; 438/149, 517

(56) References Cited

U.S. PATENT DOCUMENTS

| 3,986,180 A | * | 10/1976 | Cade | .......................... 365/149 |
|---|---|---|---|---|
| 4,195,282 A | | 3/1980 | Cameron | ..................... 341/172 |
| 4,872,010 A | | 10/1989 | Larson et al. | ................ 341/134 |
| 5,428,237 A | | 6/1995 | Yuzurihara et al. | ......... 257/349 |
| 5,466,961 A | | 11/1995 | Kuchi et al. | ................. 257/379 |
| 5,471,087 A | * | 11/1995 | Buerger, Jr. et al. | ......... 257/532 |
| 5,489,792 A | * | 2/1996 | Hu et al. | ..................... 257/347 |

FOREIGN PATENT DOCUMENTS

| EP | 0 540 163 A2 | 5/1993 |
|---|---|---|
| JP | 62-23152 | 1/1987 |

OTHER PUBLICATIONS

Patent Abstracts of Japan for Japanese Kokai 63–260065 (Oct. 27, 1988).

Patent Abstracts of Japan for Japanese Kokai 3–11663 (Jan. 18, 1991).

* cited by examiner

*Primary Examiner*—George C. Eckert, II
(74) *Attorney, Agent, or Firm*—Fitzpatrick, Cella, Harper & Scinto

(57) ABSTRACT

In a semiconductor device which has capacitors respectively connected to multiple input terminals, and in which the remaining terminals of the capacitors are commonly connected to a sense amplifier, the capacitors and the sense amplifier are formed by utilizing a semiconductor layer on an insulating surface, whereby high-speed, high-precision processing of signals having a large number of bits supplied from the multiple input terminals is realized by a small circuit scale.

1 Claim, 19 Drawing Sheets

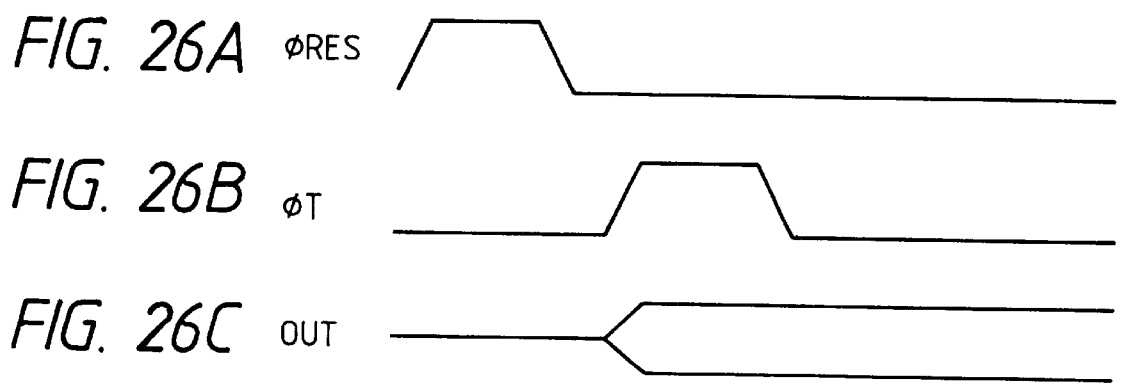
FIG. 26A ΦRES
FIG. 26B ΦT
FIG. 26C OUT
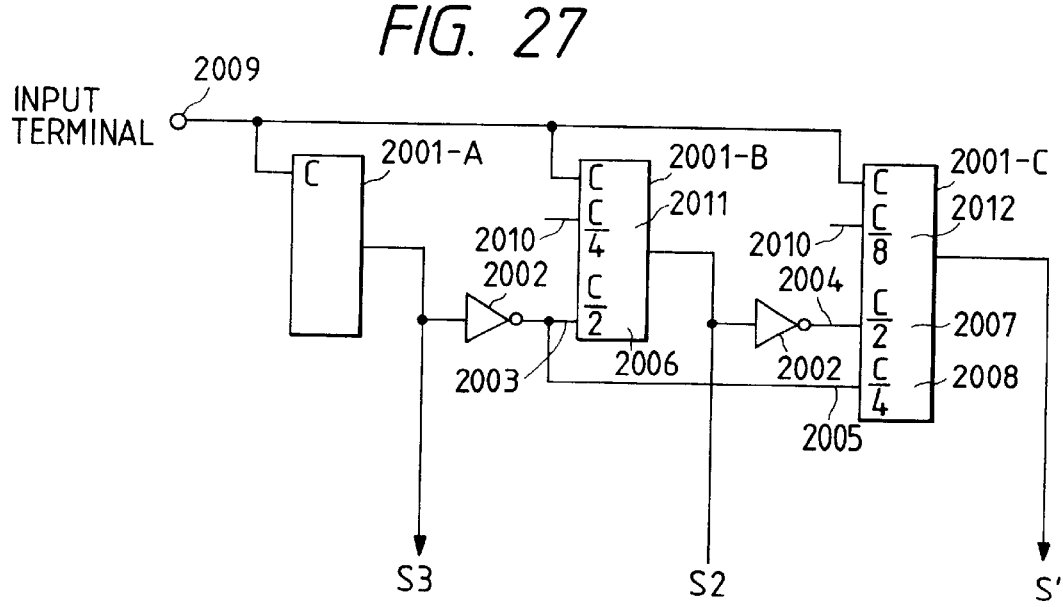
FIG. 27

SEMICONDUCTOR DEVICE, AND OPERATING DEVICE, SIGNAL CONVERTER, AND SIGNAL PROCESSING SYSTEM USING THE SAME SEMICONDUCTOR DEVICE

BACKGROUND OF THE INVENTION

1. Field of the Invention

The present invention relates to a semiconductor device, and an operating device, a signal converter, and a signal processing system using the semiconductor device and, more particularly, to a semiconductor device which can perform parallel arithmetic operations, and an operating device which can perform, e.g., a correlation arithmetic operation, a signal converter for A-D (analog-to-digital) or D-A (digital-to-analog) converting a signal, and a signal processing system using the semiconductor device.

2. Related Background Art

In recent years, upon improvement in signal processing, it has become important to realize low-cost operating devices which can process a very large volume of data at high speed within a short period of time. In particular, techniques for a correlation operating device which can be used in motion detection of dynamic images, a high-precision analog-to-digital (A/D) converter, a spread spectrum (SS) communication, and the like require signal processing on the order of GHz. Conventionally, when such a function is realized by a semiconductor integrated circuit, parallel arithmetic operations are attained using a plurality of semiconductor chips so as to attain high-speed processing, or circuits are integrated on a considerably large chip using the latest micro-layout rule.

As is well known, the circuit scale of a chip immediately increases when the number of bits of a signal to be processed increases. For example, the circuit scale increases in proportion to the square of the number of bits to be operated. Therefore, as the number of bits increases, the cost increases, or the circuit scale increases up to an impractical level in many cases.

SUMMARY OF THE INVENTION

It is an object of the present invention to provide a semiconductor device which can realize new signal processing that can solve the conventional problems described above. It is another object of the present invention to provide a semiconductor device which can realize a high-speed arithmetic operation using a smaller scale circuit than a conventional device if the number of bits remains the same. It is still another object of the present invention to provide a semiconductor device which can prevent an increase in circuit scale even when the number of bits to be operated increases. It is still another object of the present invention to provide a semiconductor device which can perform an arithmetic operation with a higher precision than a conventional device using the same working technique as the conventional device. It is still another object of the present invention to provide a semiconductor device which can realize a signal processing function, that cannot be realized by a conventional device or requires very high cost, at a practical low price.

It is still another object of the present invention to provide an operating device, a signal converter, and a signal processing system using the semiconductor device.

It is still another object of the present invention to provide a semiconductor device which comprises a plurality of input terminals, a plurality of capacitor electrically connected to the input terminals, and a sense amplifier to which the remaining terminals of the capacitor are commonly and electrically connected, and in which the capacitor and the sense amplifier are formed by utilizing a semiconductor layer on an insulating surface, and to provide an operating device, a signal converter, and a signal processing system using the device.

BRIEF DESCRIPTION OF THE DRAWINGS

FIGS. 26A to 26C are timing charts for explaining the operation timings;

FIG. 27 is a circuit diagram for explaining an A/D converter;

DETAILED DESCRIPTION OF THE PREFERRED EMBODIMENTS

Figure 1:
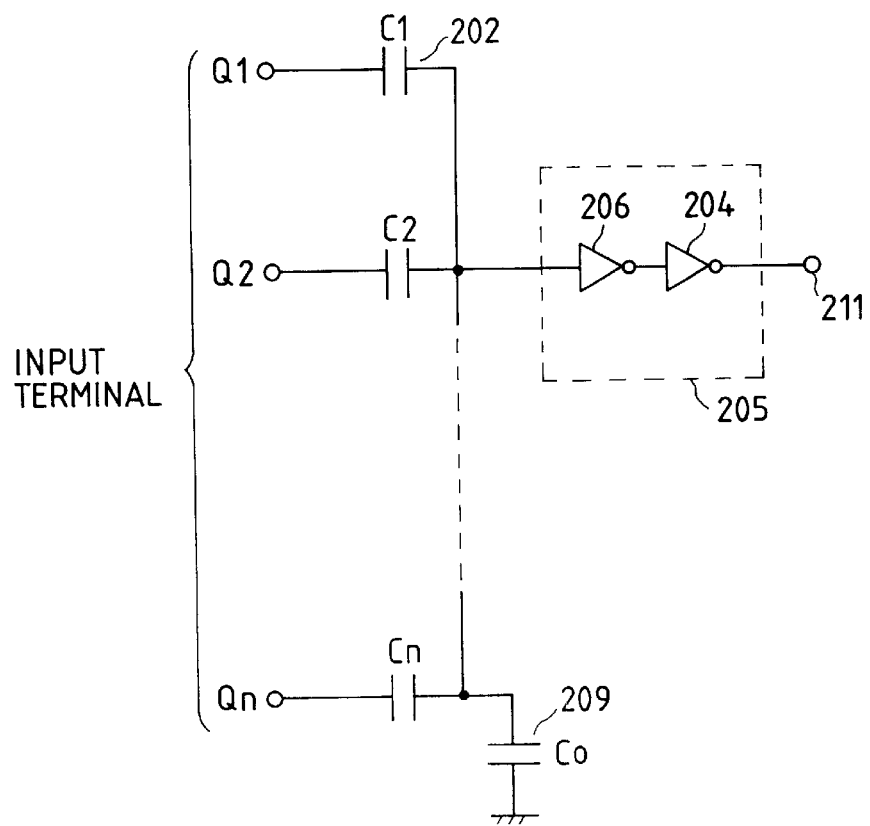
FIG. 1 is an equivalent circuit diagram of a semiconductor device according to the present invention.

A semiconductor device of the present invention which can attain the above objects comprises a plurality of capacitors each having one terminal connected to a plurality of input terminals, and a sense amplifier to which the remaining terminals of the capacitors are commonly connected, and the sense amplifier is formed on a semiconductor layer on an insulating surface.

According to the semiconductor device with the above arrangement, a signal of a large number of bits input from multiple input terminals can be precisely processed at very high speed and by a small circuit scale.

Furthermore, since a switch element is arranged on at least one of the two terminals of each capacitor of the semiconductor device, a high-precision circuit that can reduce noise can be realized.

In addition, since each capacitor of the semiconductor device is formed by connecting a plurality of capacitor elements having the same structure in parallel with each other, a circuit that can attain an arithmetic operation with higher precision can be realized.

The circuit scale of an operating device such as a majority operating circuit, which has a plurality of semiconductor devices as described above and performs parallel arithmetic operation processing by inputting the output from the first semiconductor device and/or the inverted output of the output to the second semiconductor device, is reduced, thus attaining a high operation speed and lost cost.

Furthermore, in the semiconductor device, if the minimum capacitance of the capacitor corresponding to the multiple input terminals is represented by C, majority operating processing can be performed using the total of the capacitance values of the commonly connected capacitor, the total being a value which is an odd multiple or almost an odd multiple of the minimum capacitance C.

In the semiconductor device, since the switch elements and the sense amplifier connected to the capacitor are formed by utilizing field effect transistors, a circuit that requires lower cost but can attain higher precision can be realized.

In the semiconductor device, since the field effect transistors are isolated by a mesa structure, a circuit that can attain higher integration but requires lower cost can be realized.

In the semiconductor device, since each capacitor is formed by utilizing a conductive layer which is formed in the same process as the gate electrode of the field effect transistor, and a semiconductor layer on the insulating surface, a circuit that can attain higher precision but requires lower cost can be realized.

Furthermore, in the semiconductor device, since a power supply is connected to the well layer of the field effect transistor, a high-speed circuit that can eliminate operation errors and can be used at a higher power supply voltage can be realized.

Moreover, in the semiconductor layer, since at least the well layer below a gate electrode is set in a depleted state upon formation of the channel of the field effect transistor, a high-speed, high-integration circuit can be realized.

In the semiconductor device, since the edge shape of the mesa-isolated semiconductor layer has an angle of at least 60° or more with respect to the insulating surface, a circuit having a smaller chip size can be realized.

In the semiconductor device, since the capacitor has a stored type MOS structure which uses the surface of the semiconductor layer on the insulating surface in a stored state, a circuit which can attain a higher precision but requires lower cost can be realized.

In the semiconductor device, since terminals on the side of the multiple input terminals are connected to the same layer as the gate electrode, an inexpensive circuit in which the signal to be detected is not easily influenced by external noise can be realized.

In the semiconductor device, since terminals on the side of the multiple input terminals are connected to the same layer as the semiconductor layer, an inexpensive circuit in which the input signal is not easily influenced by external noise can be realized.

In the semiconductor device, since an impurity layer of a first conductivity type, which layer is connected to the well layer and has the same conductivity type as that of the well layer, and an impurity layer of a second conductivity type, which layer forms the source region of the field effect transistor are formed at substantially neighboring positions, and a wiring layer is connected commonly to the impurity layers of the first and second conductivity types, a high-speed circuit which can eliminate operation errors and can be used at a higher power supply voltage can be realized in a smaller chip size.

In the semiconductor device, since the semiconductor layer of the capacitor is doped with an n- or p-type impurity at a concentration of $10^{18}$ (cm$^{-3}$) or more, a circuit which allows a high-precision arithmetic operation can be realized.

The operating device, signal converter, and signal processing system using the above-mentioned semiconductor device can perform high-precision, high-speed processing.

The present invention will be described in detail hereinafter with reference to the accompanying drawings as needed.

<First Embodiment>

The first embodiment of the present invention will be described below with reference to FIGS. 1 to 3. FIG. 1 is an equivalent circuit diagram of a semiconductor device according to the present invention. In FIG. 1, a change in signal of a floating node 202 caused by operating in parallel signals $Q_1$ to $Q_n$ by coupling capacitors $C_1$ to $C_n$ is detected by a sense amplifier 205, and the detected change is supplied to an output terminal 211 as an L- or H-level signal. For example, the sense amplifier 205 is constituted by two inverters 206 and 204. However, the present invention is not limited to this arrangement. The input signals and the signal appearing at the floating node 202 have a relationship to be described below. Let $\Delta V_1$ to $\Delta V_n$ be the amounts of change in potential of the signals $Q_1$ to $Q_n$ from an initial state, and $\Delta V_f$ be the amount of change in potential of the floating node. Since the sum total of the charges of the floating node does not change before and after signal input (=principle of conservation of charge), we have:

$$C_1(\Delta V_1 - \Delta V_f) + C_2(\Delta V_2 - \Delta V_f) + \ldots + C_n(\Delta V_n - \Delta V_f) = C_0 \Delta V_f$$

where $C_0$ is the parasitic capacitance of the floating node. The above equation is modified as follows:

$$\Delta V_f = (C_1 \Delta V_1 + C_2 \Delta V_2 + \ldots + C_n \Delta V_n)/(C_0 + C_1 + C_2 + \ldots + C_n)$$

More specifically, the above-mentioned circuit has a circuit arrangement for outputting a linear sum of the potential changes of the respective terminals weighted with $C_i$. The sense amplifier 205 detects if $\Delta V_f$ is larger or smaller than a predetermined reference value, and can output the detection result to the output terminal 211 as a signal "0" or "1". In the case of analog signals, for example, the above-mentioned circuit can be used as a neuron element which detects the weighted magnitudes of the inputs at the respective terminals. In the case of digital signals, for example, the above-mentioned circuit can constitute a majority logic circuit which compares the numbers of H- and L-level signals of the input signals.

Figure 2:
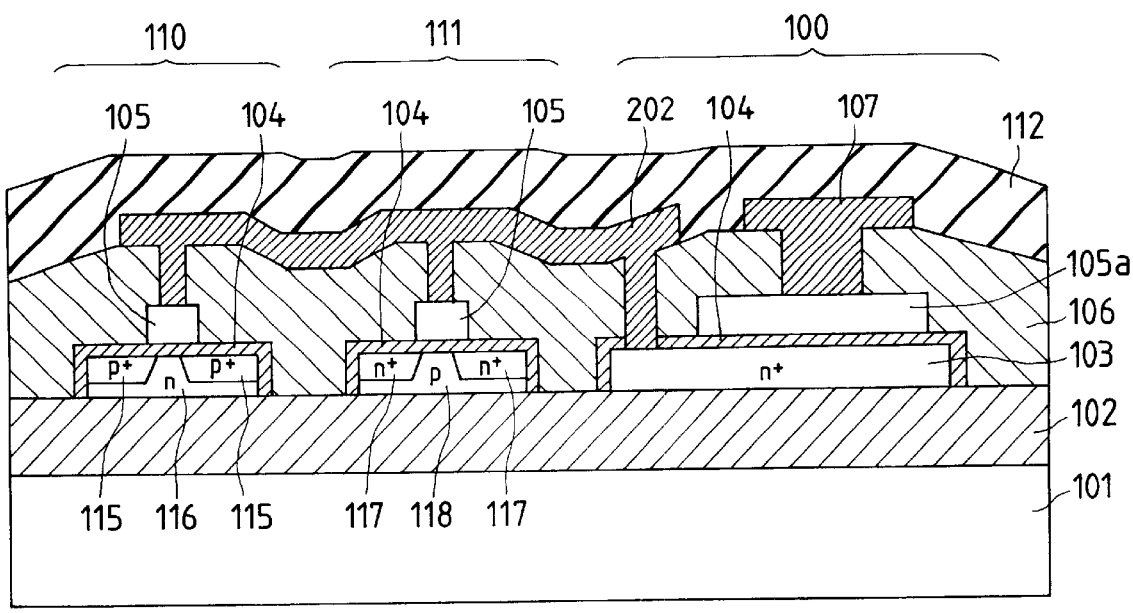
FIGS. 2, 4, 8, 10, 12, 13, and 16 are sectional views of the semiconductor device according to the present invention.
Figure 4:
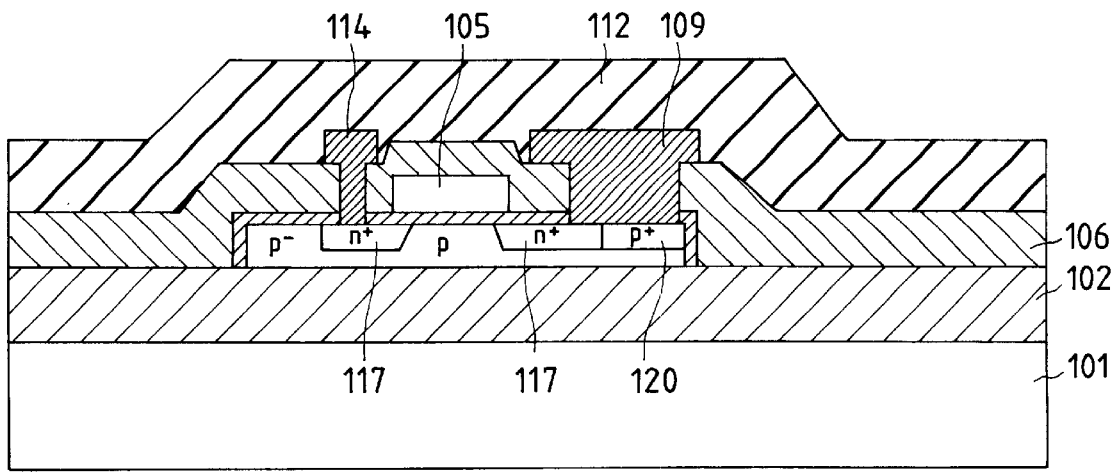
Figure 5:
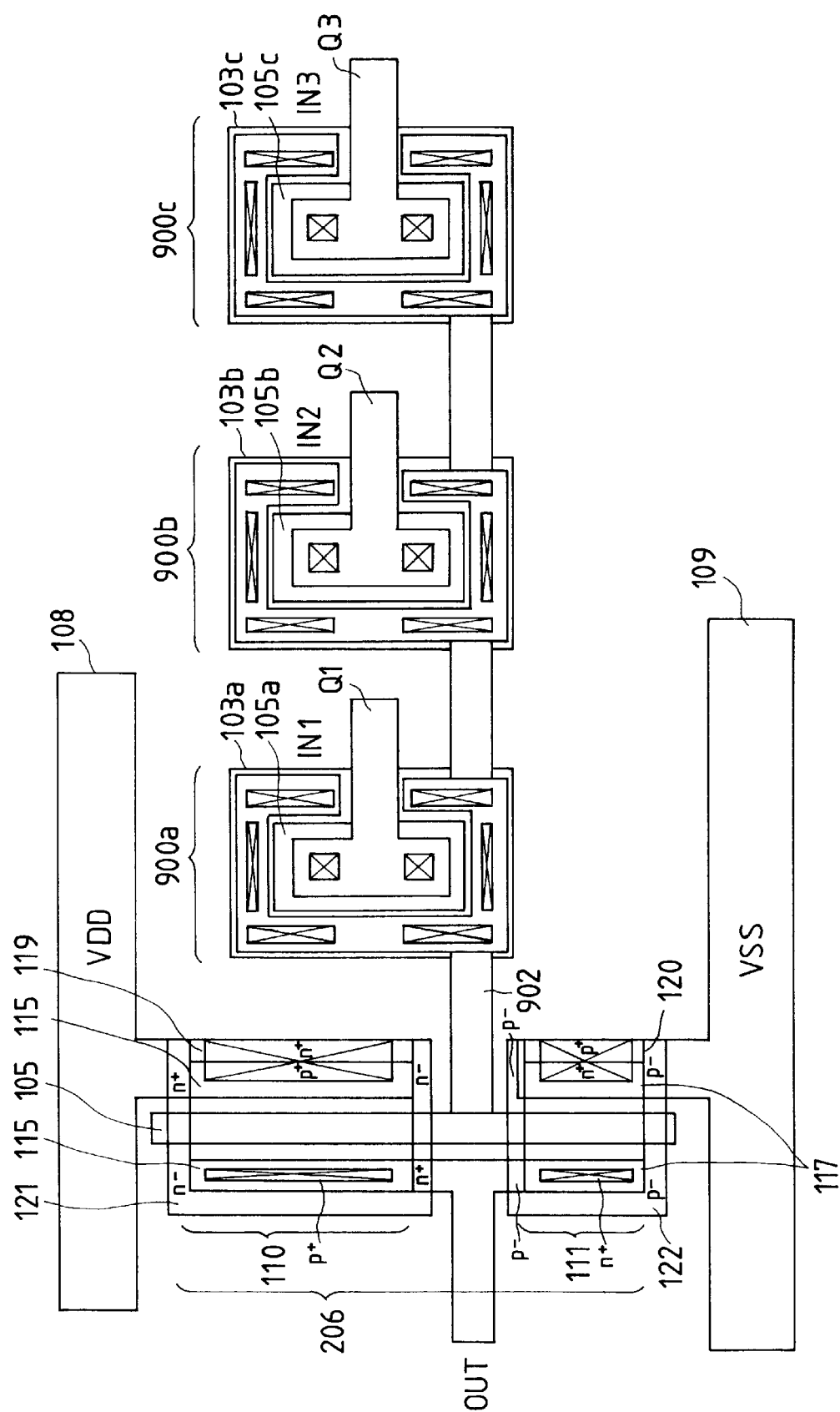

FIG. 2 is a sectional view for explaining a preferred example that realizes the circuit shown in FIG. 1 using a semiconductor device. FIG. 2 shows a portion of the circuit shown in FIG. 1. FIG. 3 is a plan view for explaining a preferred example that realizes the circuit shown in FIG. 1 using a semiconductor device. FIG. 3 shows a portion of the circuit shown in FIG. 1. FIG. 4 is a sectional view of the device shown in FIG. 3 taken along a line 4—4 in FIG. 3. FIG. 5 is a plan view when the above-mentioned n is set to be n=3.

Referring to FIGS. 2 to 5, the semiconductor device comprises a capacitor element 100, a semiconductor substrate 101, an insulating layer 102, a semiconductor-side electrode 103 consisting of an n$^+$-type semiconductor layer, an insulating film 104, gate electrodes 105, electrodes 105a to 105c, a first insulating interlayer 106, a signal input electrode 107, a $V_{DD}$ power supply line 108, a $V_{SS}$ power supply line 109, a PMOS transistor 110, an NMOS transistor 111, a second insulating interlayer 112, an output terminal 114, p+-type regions (p+-type source-drain regions) 115, an n-type well 116, n+-type regions (n+-type source-drain regions) 117, a p-type well 118, an n+-type region 119, a p+-type region 120, an n−-type region 121, a p−-type region 122, capacitor elements 900a to 900c, and a floating node 902.

Referring to FIG. 2, the insulating layer 102 such as a silicon oxide film is formed on the semiconductor substrate 101. The capacitor element 100 for realizing capacitive coupling, and the NMOS and PMOS transistors 111 and 110, which constitute an input inverter of the sense amplifier, are formed on the insulating layer 102. The gate electrodes 105 of the transistors are connected to one semiconductor-side electrode 103 of the capacitor element, and the other electrode 105a, which is formed by utilizing the same layer as the conductive layer forming the gate electrode of the transistor, is connected to the signal input electrode 107. The entire device is covered by the first and second insulating interlayers 106 and 112. The capacitor element 100, and the NMOS and PMOS transistors 111 and 110 are mesa-isolated on the insulating layer 102. The edge portion of each transistor shown in FIG. 2 preferably has an almost right-angled shape. This is because a leakage between the source and drain easily occurs due to a decrease in threshold value of a very thin portion of a silicon film when the silicon film has a slope. More specifically, since the thin portion of the silicon film has a small semiconductor region to be depleted, a channel is formed by a lower gate voltage, thus often causing a leakage. The present applicant prepared samples having edge portions with various slope angles, and confirmed upon measurement of the leakage currents that the above-mentioned phenomenon could be eliminated to a negligible level when the slope angle was set to be 60° or more.

The capacitance of the capacitor element 100 shown in FIG. 2 is preferably maintained constant as much as possible independently of the voltage applied across the capacitor elements. When such a capacitor element is realized by one having a MOS structure, an impurity is preferably doped in the semiconductor layer at a high concentration, so that the semiconductor surface is always prevented from being depleted or population-inverted, i.e., the semiconductor surface has a MOS structure in a stored state (stored type MOS structure). Furthermore, according to the experimental results of the present applicant, it was found that the semiconductor surface could be maintained in a stored state in practice if the impurity was doped in the semiconductor layer at $10^{18}$ (cm$^{-3}$) or higher. An impurity is doped in the semiconductor-side electrode 103 at, e.g., $10^{19}$ (cm$^{-3}$) to have n+ conductivity type, and the capacitance value is almost constant independently of the bias voltage. In this case, p+-type doping may be performed. As the insulating film between the two electrodes, the same layer as the gate electrode of the MOS transistor is used. However, the present invention is not limited to this insulating layer, but another insulating layer may be formed. Each n+-type source-drain region 117 of the NMOS transistor is formed to have a depth slightly smaller than the thickness of the silicon film of the p-type well 118. However, this depth may be equal to or larger than the thickness of the silicon film. The same applies to the p+-type source-drain regions 115 and the n-type well 116 of the PMOS transistor.

In order to improve the hot carrier resistance and withstand voltage, the source-drain regions may have a DDD (Doubly Diffused Drain) structure or an LDD (Lightly Diffused Drain) structure, as a matter of course. The insulating layer 102 preferably has a larger thickness since the capacitance between the silicon layer and the substrate can be reduced, and there is no fear of a parasitic CMOS operation that uses the substrate as the gate electrode. For example, an SIMOX substrate normally has an insulating region having a thickness of 3,900 Å. However, in an SOI substrate manufactured using an adhesion technique, the insulating region may have a thickness of 1 micron or more.

Figure 3:
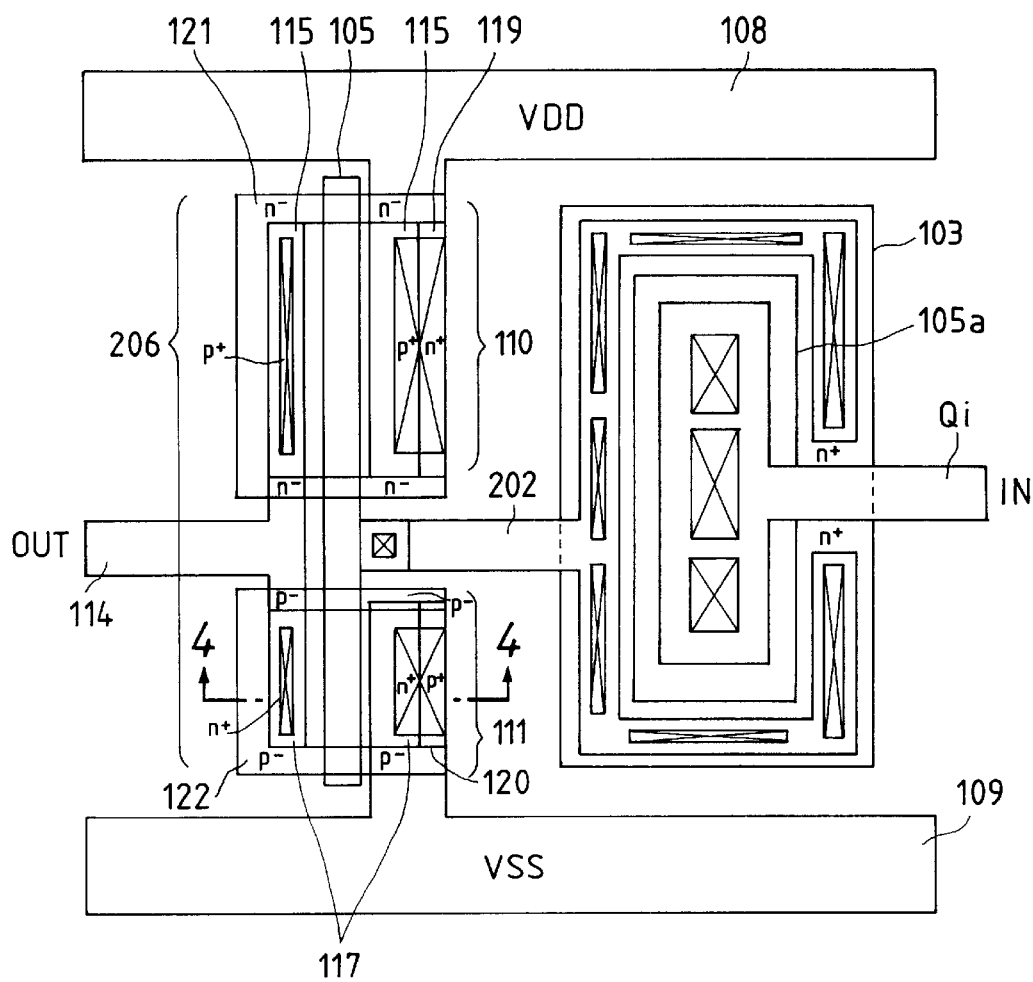
FIGS. 3, 5, 6, 7, 9, 11, 14, 15, and 22 are plan views of the semiconductor device according to the present invention.

The same reference numerals in FIG. 3 denote the same parts as in FIG. 2. In both the PMOS and NMOS transistors 110 and 111, low-concentration regions (the n−-type region 121 in the PMOS transistor, and the p−-type region 122 in the NMOS transistor) are formed around the source-drain regions. Such a structure is adopted in consideration of the fact that a junction leakage easily occurs if a p-n junction is present at the end face of the mesa-etched silicon film. By improving the crystal quality of the SOI substrate, the frequency of leakage can be lowered. It is also known that a channel is easily formed under the gate electrode extending over the silicon end face. Since the low-concentration layer is formed, the leakage current can be prevented from flowing through the source and drain. Each of the NMOS and PMOS transistors has a so-called partial depletion MOS structure in which the well is depleted only partially even when the channel is ON. This structure can prevent a variation in electrical characteristics of the transistor such as the threshold value, drive performance, and the like independently of a variation in film thickness of the silicon film. As will be described later, this structure can improve the withstand voltage and can prevent operation errors by forming a well contact.

As shown in FIG. 3, the source electrodes of the NMOS and PMOS transistors 111 and 110 constituting the inverter are respectively connected to the $V_{SS}$ and $V_{DD}$ power supply lines 109 and 108.

A contact structure between the source region and the power supply line adopts a so-called butting contact structure in which a well contact and a source contact are formed adjacent to each other, and are connected using a single wiring line. However, a structure having only a source contact may be adopted without forming a well contact.

In FIG. 3, the p+-type region 115 as the source region of the PMOS transistor and the n+-type region 119 serving as the well contact are formed adjacent to each other, and are connected using a single wiring line. The same applies to the source region 117 and the well contact p+-type region 120 of the NMOS transistor. By fixing the well potential, the operation of the MOS transistor is stabilized, and operation errors can be prevented. In particular, in the case of the SOI substrate, unnecessary carriers which are generated in the channel and accumulate in the well can be absorbed as soon as possible.

The drains of the PMOS and NMOS transistors are commonly connected to constitute one output terminal 114.

(Arrangement in Case of Three Inputs)

FIG. 5 is a plan view showing the case wherein the number of input terminals is set to be three (n=3), and identical capacitor elements 900a, 900b, and 900c are connected to the input terminals $Q_1$ to $Q_3$. Electrodes 103a, 103b, and 103c opposite to the input electrodes 105a, 105b, and 105c of the capacitor elements are connected to the common floating node 902 via contact holes. Since other arrangements are the same as those in FIG. 3, a detailed description thereof will be omitted.

In the above-mentioned case, $C_1=C_2=C_3$. Of course, an arrangement of $C_1 \neq C_2 \neq C_3$ is available. Such an arrangement can be designed if the areas of the capacitor elements are changed.

Figure 6:
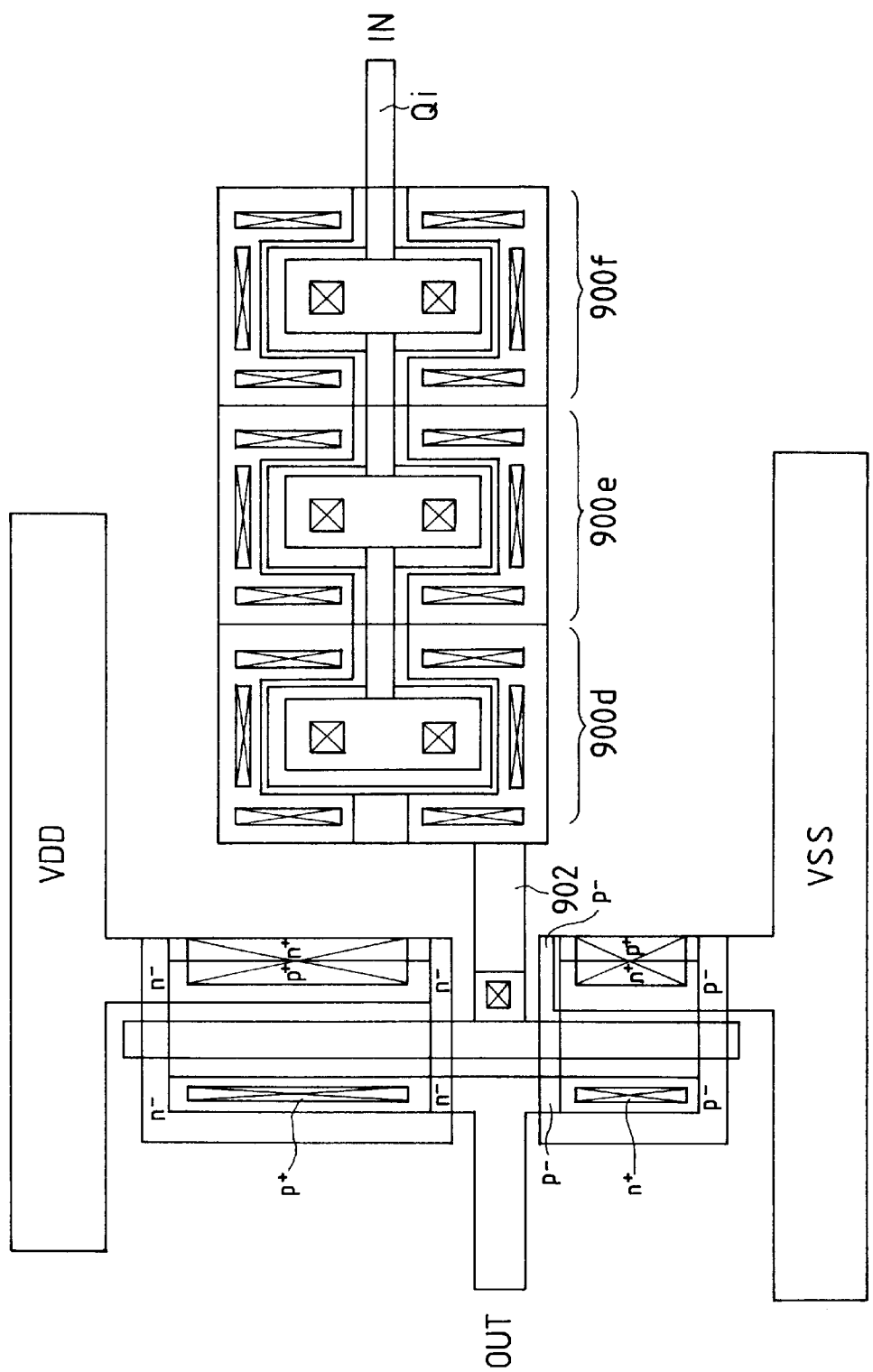

FIG. 6 shows a preferred example used when the area of the capacitor element is changed. FIG. 6 is a plan view showing a case wherein a capacitance three times that in FIG. 5 is assigned to a given input terminal $Q_i$. In order to form a ×3 capacitance, elements 900d, 900e, and 900f having the same structure are connected in parallel with each other. As described above, when the capacitor element is constituted by a parallel circuit of an integer number of elements having a small capacitance, the ratio of the capacitance values connected to different input terminals can be maintained even when the capacitance values vary due to indefinite factors such as a process variation, a parasitic capacitance, and the like.

(Another Arrangement of Well Contact)

Figure 7:
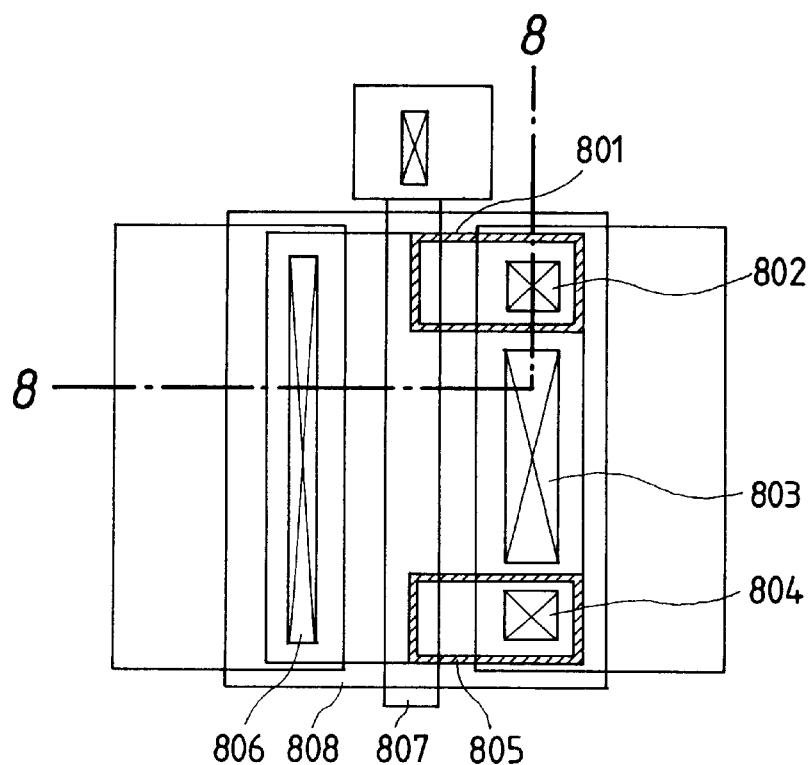
Figure 8:
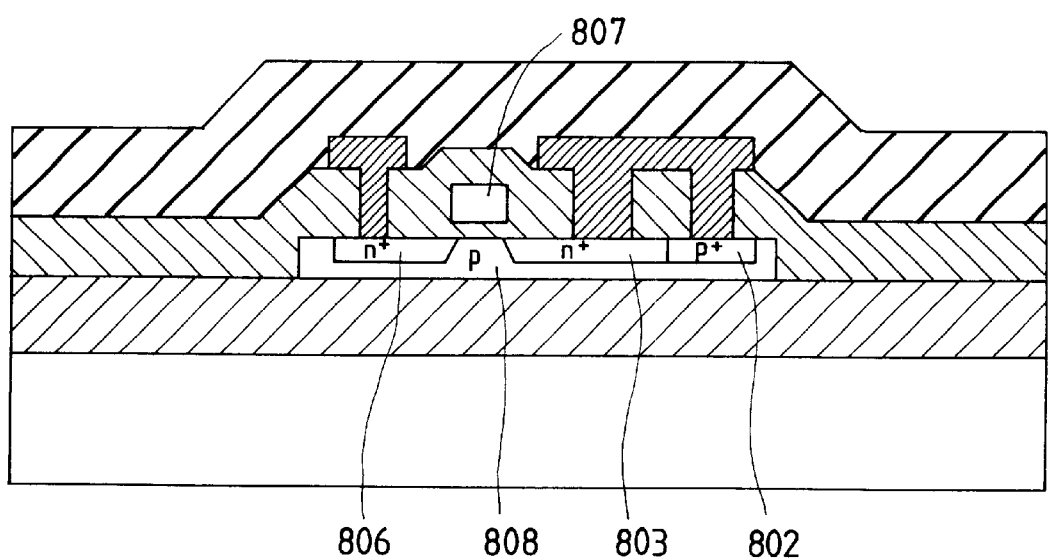

FIG. 7 is a plan view showing a preferred example of another arrangement of the butting contact structure between the well and source. FIG. 8 is a sectional view taken along a line 8—8 in FIG. 7. As the structure of the NMOS transistor, a $p^+$-type well contact is formed adjacent to the gate of the MOS transistor. When a well contact is formed near the channel, unnecessary carriers in the channel can be efficiently absorbed. In FIG. 7, the well contact is formed at the end of the transistor so as to prevent an increase in size of the transistor as much as possible. The same structure can be applied to the PMOS transistor to constitute an inverter.

Note that the structure shown in FIGS. 7 and 8 includes $p^+$-type ion-implantation mask patterns 801 and 805, $p^+$-type contacts 802 and 804, $n^+$-type contacts 803 and 806, a gate electrode 807, and a p-type region 808.

Figure 9:
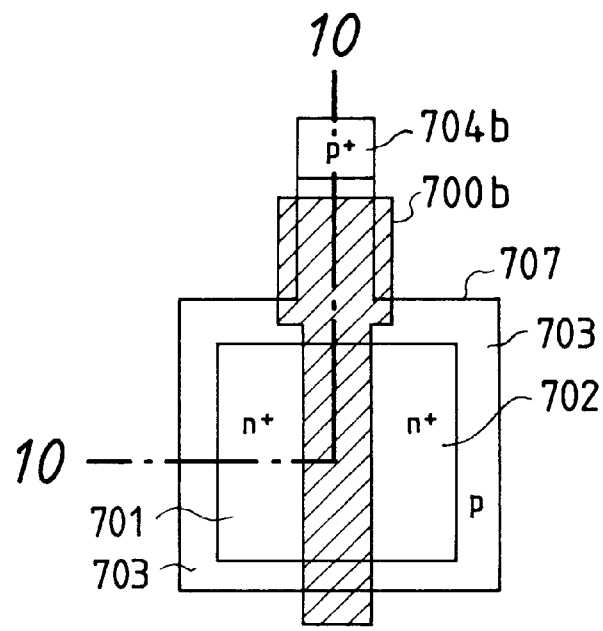
Figure 10:
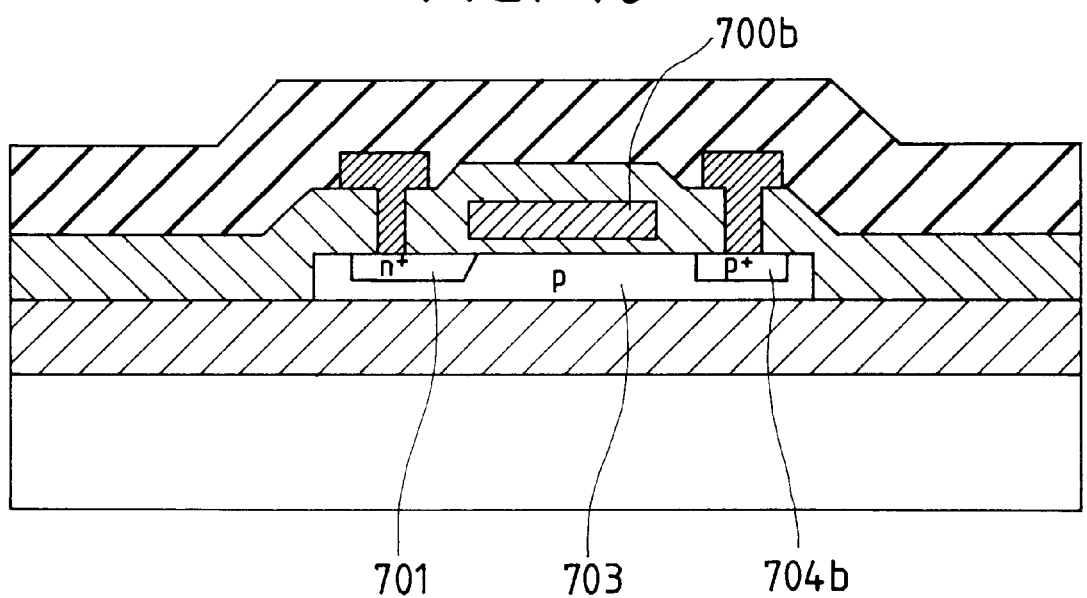
Figure 11:
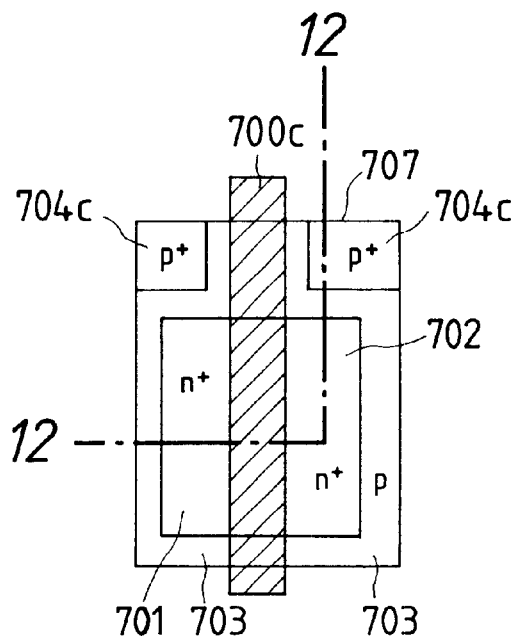
Figure 12:
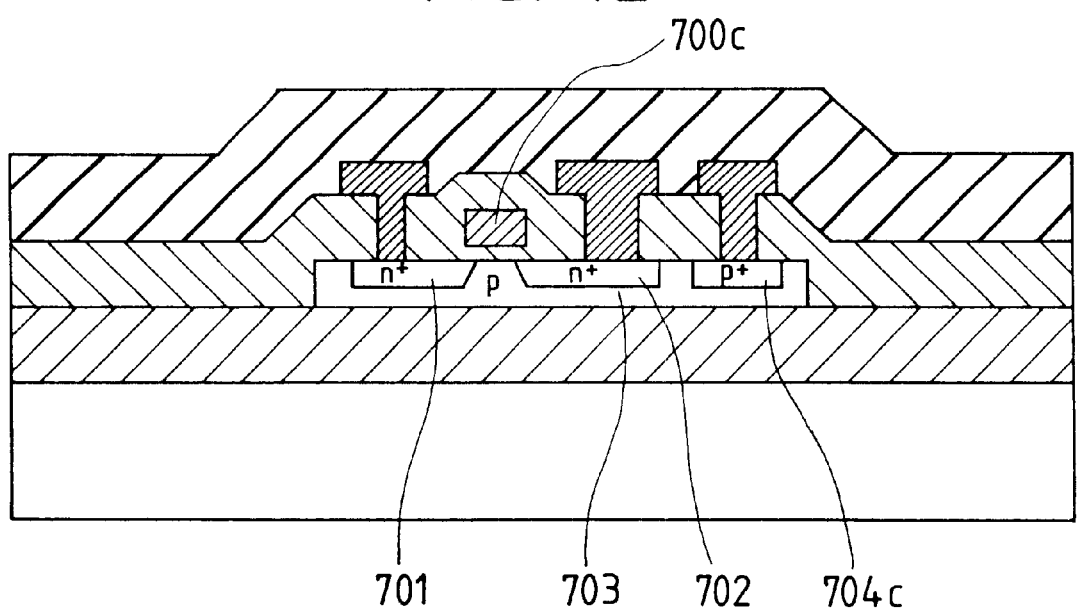

FIGS. 9 and 11 are plan views for explaining a preferred example of the NMOS transistor used when the well contact is set at a potential independently of the drain and source electrodes. FIG. 10 is a sectional view taken along a line 10—10 in FIG. 9, and FIG. 12 is a sectional view taken along a line 12—12 in FIG. 11.

The structures shown in FIGS. 9 to 12 include a source 701, a drain 702, a region 703, a $p^+$-type contact 704b, $p^+$-type well contact regions 704c, gate electrodes 700b and 700c, and a silicon film formation region 707.

Referring to FIG. 9, the silicon film formation region 707 is extended outside the gate electrode 700b for isolating the source 701 and the drain 702 so as to form the $p^+$-type contact 704b. On the other hand, in FIG. 11, the $p^+$-type well contact regions 704c are formed on the silicon film formation region 707 on the drain or source side at positions separated from the source or drain. The structures shown in FIGS. 9 and 11 are effective when a transmission gate in which the well contact cannot be set at the same potential as the source or drain electrode is used.

Since the semiconductor device has the above-mentioned arrangement of the present invention, the following effects are expected.

(1) Since multiple input signals are supplied to one floating node via the capacitor, and a signal, output from the floating node is detected by the sense amplifier, a semiconductor device which can minimize an increase in circuit scale upon an increase in the number of bits, and hence, requires lower cost can be provided.

(2) Since the number of times of logic operations does not increase upon an increase in the number of inputs (the number of bits), a semiconductor device which can perform arithmetic operations at higher speed than a conventional device can be provided.

(3) Since a simple arrangement and isolation into semiconductor regions with small areas inherent to the SOI substrate can be attained, a semiconductor device which can perform high-precision arithmetic operations using even the same working technique as that utilizing a normal semiconductor substrate can be provided.

(4) A multi-bit correlation operating device, A/D converter, and majority logic circuit, which cannot be conventionally realized due to too high a cost can be provided with a practical low cost.

In particular, in the first embodiment, the following effects are expected.

(1) Since the SOI structure is adopted, the device can be manufactured in an easy single-polysilicon layer process, and the NMOS and PMOS transistors and the like can be mesa-isolated from each other, high integration can be realized. Therefore, an inexpensive, high-integration semiconductor device can be provided.

(2) Since the isolation width between the NMOS and PMOS transistors is small, the parasitic capacitance $C_O$ of the floating node can be reduced.

(3) Since the input terminals are connected to only the polysilicon gate layer isolated from the semiconductor substrate, the potential can be prevented from fluctuating due to noise input to the substrate.

(4) Since the partial depletion MOS structure is adopted, a high-precision, high-yield semiconductor device whose electrical characteristics such as the threshold value, driving force, and the like are hardly influenced by a variation in silicon film thickness can be provided.

(5) Since the well potential is fixed, a structure, which can be used at a higher withstand voltage, can prevent operation errors of the circuit, and is not easily influenced by potential fluctuation due to external noise, can be realized.

(6) Since a structure which does not easily cause any channel leakage and any junction leakage at the silicon end is adopted, a semiconductor device which assures high yield and requires only a small consumption current in a standby state can be provided.

(7) Since the capacitor is constituted by connecting a plurality of smaller capacitor elements in parallel with each other, the relative ratio of the capacitance values of the input terminals does not easily vary. Therefore, a high-precision arithmetic operation can be attained.

<Second Embodiment>

The second embodiment will be described below with reference to FIGS. 13 and 14. In this embodiment, the input and output electrodes of the capacitor in the first embodiment are replaced. Therefore, the equivalent circuit is the same as that in the first embodiment.

Figure 13:
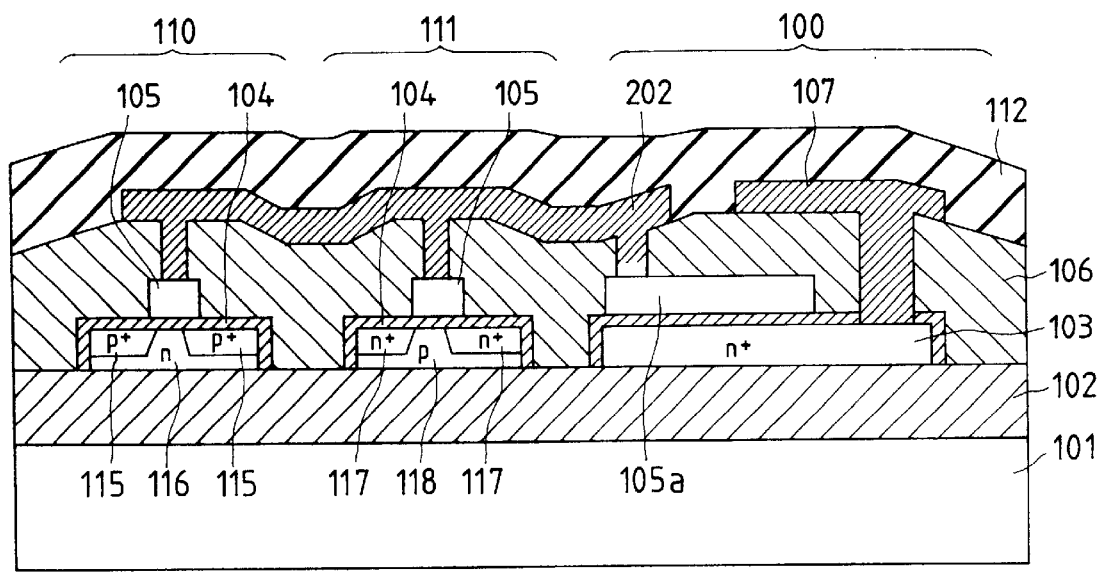
Figure 14:
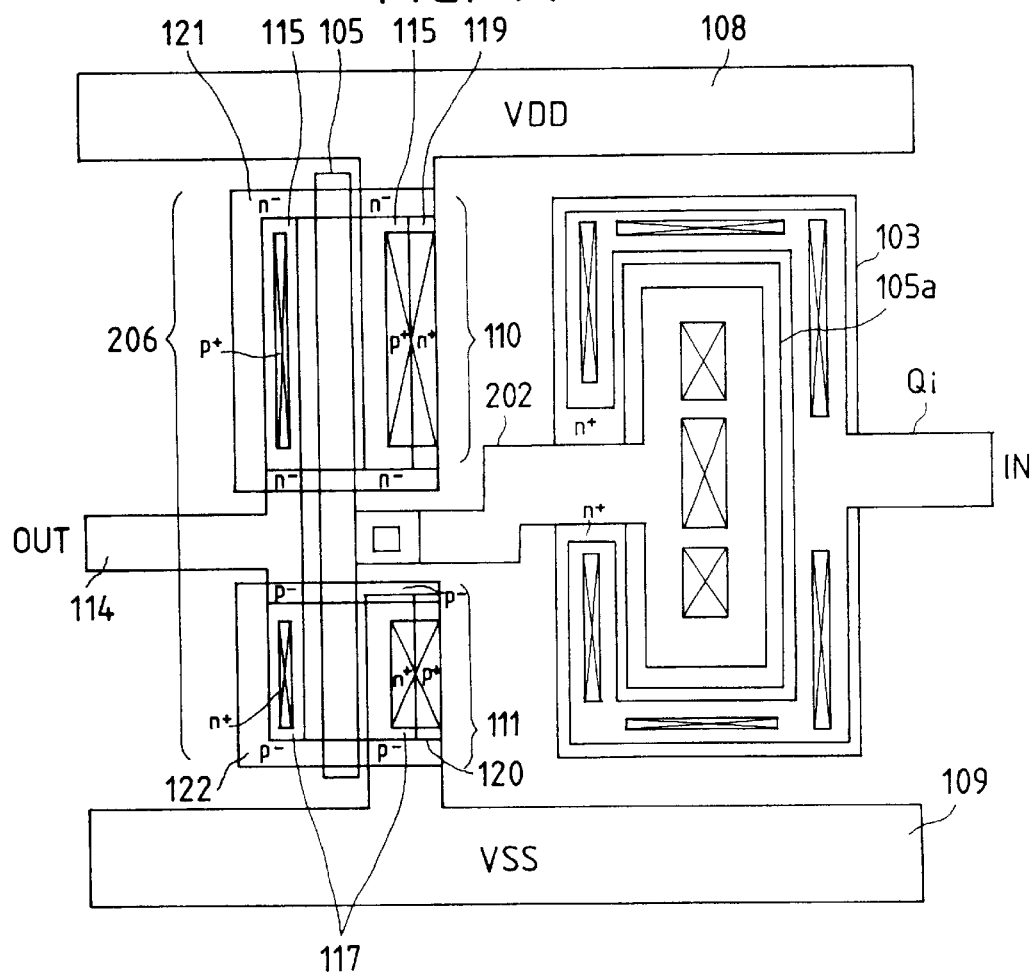

FIG. 13 is a sectional view corresponding to FIG. 2 of the first embodiment, and FIG. 14 is a plan view corresponding to FIG. 3 of the first embodiment. As shown in FIGS. 13 and 14, a signal is input to the silicon film 103 side, and the floating node is formed at the polysilicon gate 105a side. More specifically, the polysilicon gate 105a is connected to the floating node 202, and the input terminal $Q_i$ is connected to the silicon film 103.

In order to clarify the difference of this embodiment from the first embodiment, other structures are the same as those in FIGS. 2 and 3 of the first embodiment. All the variations of the transistor structure, well contact structure, parallel connection of the capacitor elements, and the like described in the first embodiment can be applied to this embodiment.

Figure 15:
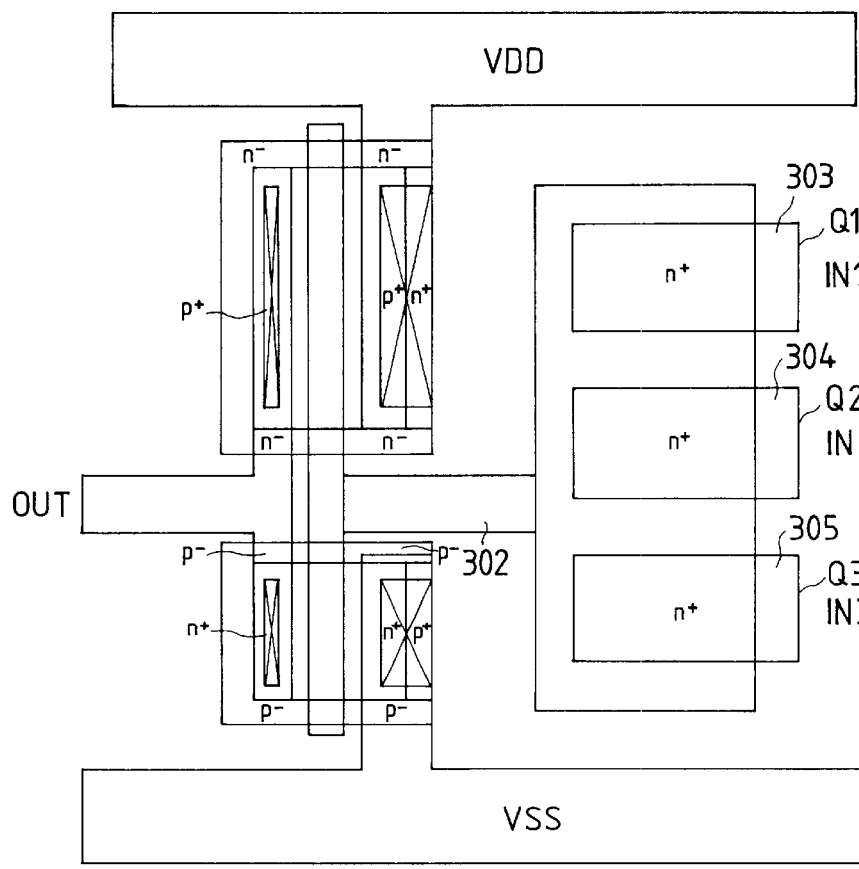

FIG. 15 shows another formation method of a capacitance portion when the floating node is formed at the polysilicon electrode side of the capacitor element. In FIG. 15, a polysilicon electrode 302 of the floating node is formed to cover most portions of silicon film patterns 303, 304, and 305 of the input signal electrodes $Q_1$, $Q_2$, and $Q_3$. The capacitance value is determined by the two-dimensional overlapping area between the silicon film and the polysilicon electrode, and the overlapping area of corner portions. Since the silicon film is formed on the flat insulating film, and has high patterning precision, the design precision of the capacitance value can be improved. Furthermore, even when the alignment precision of the floating node and the silicon film changes slightly, the relative ratio of the capacitances of the terminals $Q_1$, $Q_2$, and $Q_3$ remains the same. For this reason, the semiconductor device is suitably applied to a high-precision operating device according to the present invention.

In the semiconductor device of the second embodiment, the following effects are expected.

(1) Since the SOI structure is adopted, the device can be manufactured in an easy single-polysilicon layer process, and the NMOS and PMOS transistors and the like can be mesa-isolated from each other, high integration can be realized. Therefore, an inexpensive, high-integration semiconductor device can be provided.

(2) Since the partial depletion MOS structure is adopted, a high-precision, high-yield semiconductor device whose electrical characteristics such as the threshold value, driving force, and the like are hardly influenced by a variation in silicon film thickness can be provided.

(3) Since the well potential is fixed, a structure, which can be used at a higher withstand voltage, can prevent operation errors of the circuit, and is not easily influenced by potential fluctuation due to external noise, can be realized.

(4) Since the structure which does not easily cause any channel leakage and any junction leakage at the silicon end is adopted, a semiconductor device which assures high yield and requires only a small consumption current in a standby state can be provided.

(5) Since the capacitor is constituted by connecting a plurality of smaller capacitor elements in parallel with each other, the relative ratio of the capacitance values of the input terminals does not easily vary. Therefore, a high-precision arithmetic operation can be attained.

(6) Since the input terminals are capacitively coupled to the silicon substrate 101, potential fluctuation due to signals of other adjacent terminals can be eliminated.

(7) Since the floating node is separate from the silicon substrate 101, it is not easily influenced by potential fluctuation from the substrate. Since the parasitic capacitance $C_0$ of the floating node is small, the output signal $\Delta V_f$ can be increased when the amplitude of the input signal remains the same.

<Third Embodiment>

Figure 16:
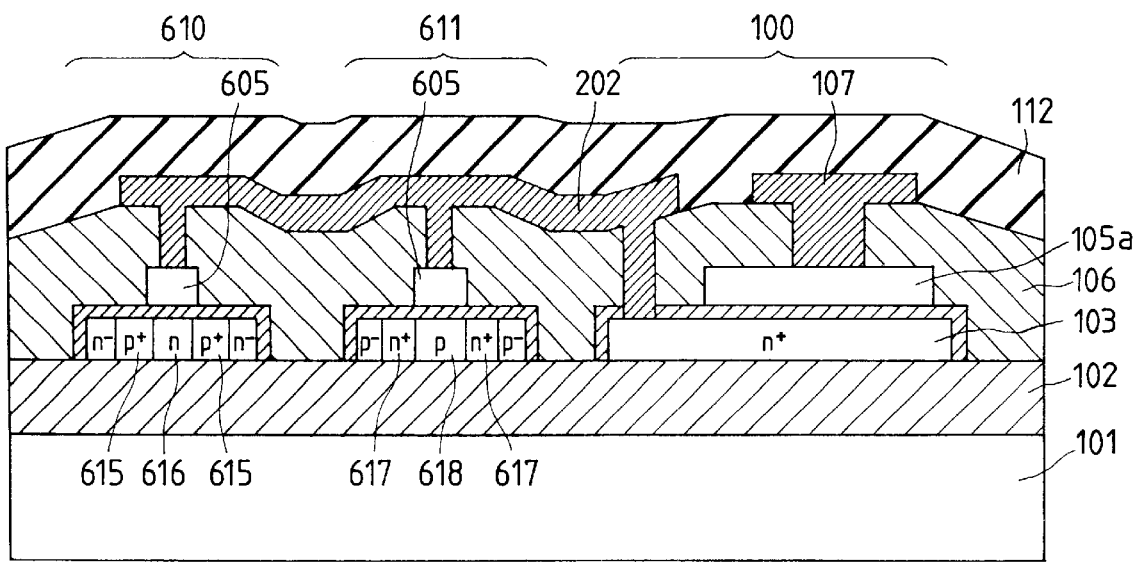

The third embodiment will be described below with reference to FIG. 16. In this embodiment, FIG. 16 is a sectional view showing a case wherein the NMOS and PMOS transistors in the first embodiment have a complete depletion structure. Therefore, the equivalent circuit diagram is the same as FIG. 1 of the first embodiment, and the same reference numerals in this embodiment denote the same parts as in the first embodiment.

The structure shown in FIG. 16 includes a PMOS transistor 610, an NMOS transistor 611, $p^+$-type source-drain regions 615, an n-type well 616, $n^+$-type source-drain regions 617, a p-type well 618, and gate electrodes 605.

The silicon film thickness is set so that both the wells 616 and 618 are completely depleted upon formation of the channels of the PMOS and NMOS transistors. The work function of the gate electrodes is appropriately selected, so that the NMOS and PMOS transistors become enhancement type transistors. For example, the gate electrode of the NMOS transistor consists of a $p^+$-type polysilicon film, and that of the PMOS transistor consists of an $n^+$-type polysilicon film. In this case, when the polysilicon surface is converted into a silicide using, e.g., titanium nitride, the degree of freedom of wiring increases.

When complete depletion MOS transistors are used, unnecessary fluctuation of the well potential can be suppressed by forming the well contact described in the first embodiment, but an arrangement without any well contact is also available. Even when the transistor structure changes and the thickness of the silicon film is decreased, no problem is posed as long as an impurity is doped in the silicon layer 103 of the capacitor element at a sufficiently high concentration. Therefore, all the variations of the well contact structure, parallel connection of the capacitor elements, and the like described in the first embodiment can also be applied to this embodiment. On the other hand, even when one of the NMOS and PMOS transistors becomes a partial depletion type transistor and the other becomes a complete depletion type transistor with respect to the preset silicon film thickness due to their considerably different well concentrations, no problem is posed.

Another example using complete depletion type MOS transistors will be described below with reference to the accompanying drawings.

Figure 17:
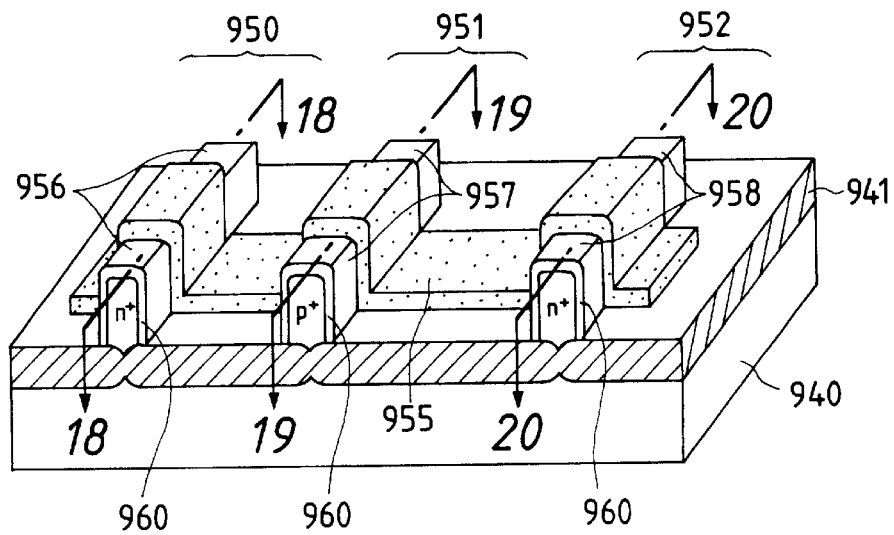
FIGS. 17 and 21 are perspective views of a MOS transistor which can be used in the present invention.
Figure 18:
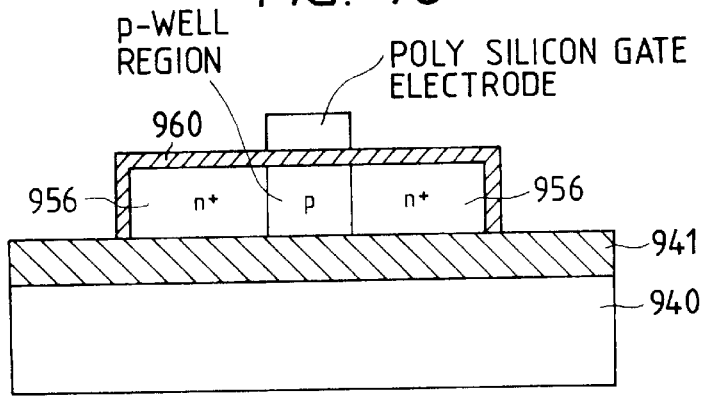
FIGS. 18, 19, and 20 are sectional views of the MOS transistor which can be used in the present invention.
Figure 19:
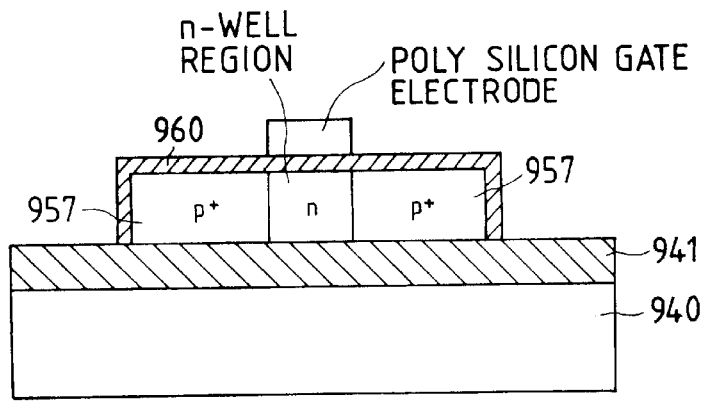
Figure 20:
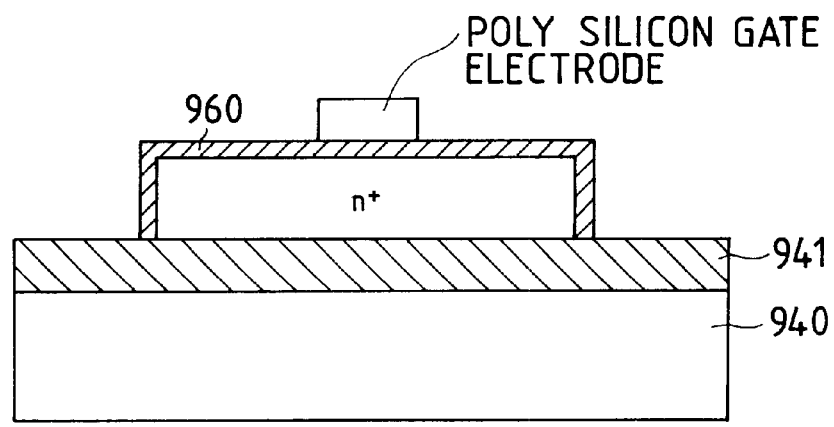

FIGS. 17 to 20 are views for explaining a preferred example using delta transistors as MOS transistors. FIG. 17 is a schematic perspective view, FIG. 18 is a sectional view of an NMOS transistor portion taken along a line 18—18 in FIG. 17, FIG. 19 is a sectional view of a PMOS transistor portion taken along a line 19—19 in FIG. 17, and FIG. 20 is a sectional view of a capacitor element portion taken along a line 20—20 in FIG. 17.

Figure 21:
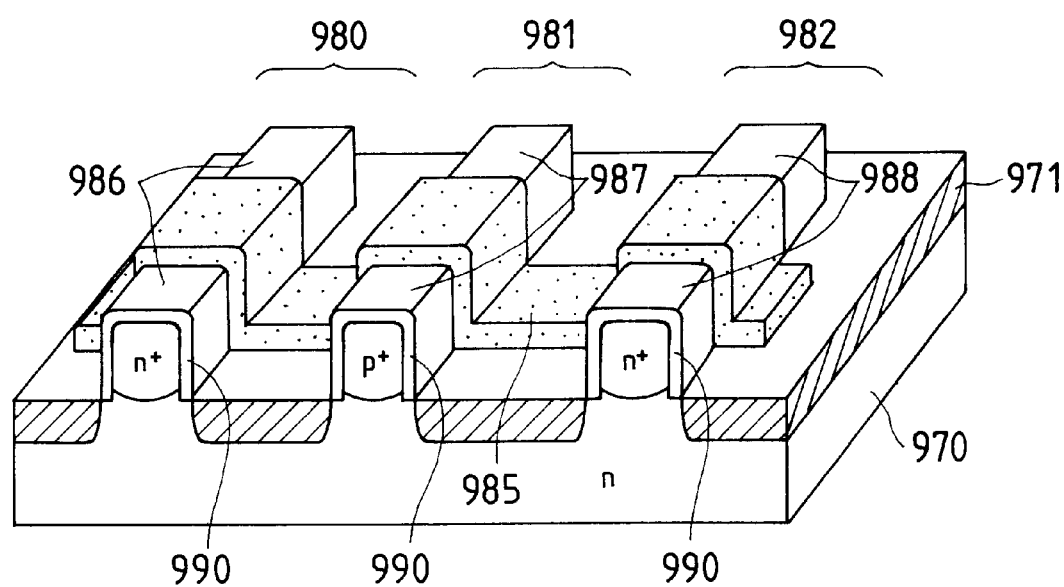

FIG. 21 is a perspective view for explaining a preferred example using double-gate transistors. Note that the sectional structures of the NMOS and PMOS transistor portions and the capacitor element portion are substantially the same as those shown in FIGS. 18 to 20, except that an oxide film 941 is omitted therefrom. In these examples, although the power supply wiring lines are not shown, the same effects as in the third embodiment can be provided by a simple structure.

The structures shown in FIGS. 17 to 20 and FIG. 21 include silicon substrates 940 and 970, thick oxide films 941 and 971, NMOS transistors 950 and 980, PMOS transistors 951 and 981, capacitor elements 952 and 982, polysilicon floating nodes 955 and 985, NMOS source-drain regions 956 and 986, PMOS source-drain regions 957 and 987, signal input terminals 958 and 988, and a gate oxide film 960.

In the semiconductor device of the third embodiments, the following effects are expected.

(1) The operation speed of each transistor is improved by several ten % by the complete depletion operation. The well contact can be omitted. These effects contribute to a transistor size reduction, i.e., a chip size reduction.

(2) Upon reduction of the transistor size, since the parasitic overlap capacitance between the floating node 202 and the drain 617 of the transistor is reduced, $C_0$ decreases. Therefore, since the output signal $\Delta V_f$ can be increased, a processing function for a larger number of bits can be realized.

(3) The effects unique to the first and second embodiments are obtained depending on the way or connection of the capacitor elements. Of course, the combination methods of this embodiment and the connection methods of the capacitor elements can be arbitrarily selected.

<Fourth Embodiment>

The fourth embodiment will be described below with reference to the plan view shown in FIG. 22. In this embodiment, switch means using a CMOS transmission gate is arranged between the input terminal and the capacitor of the second embodiment. Since the portion after the capacitor is the same as that in FIG. 5 of the second embodiment, a detailed description thereof will be omitted.

Figure 22:
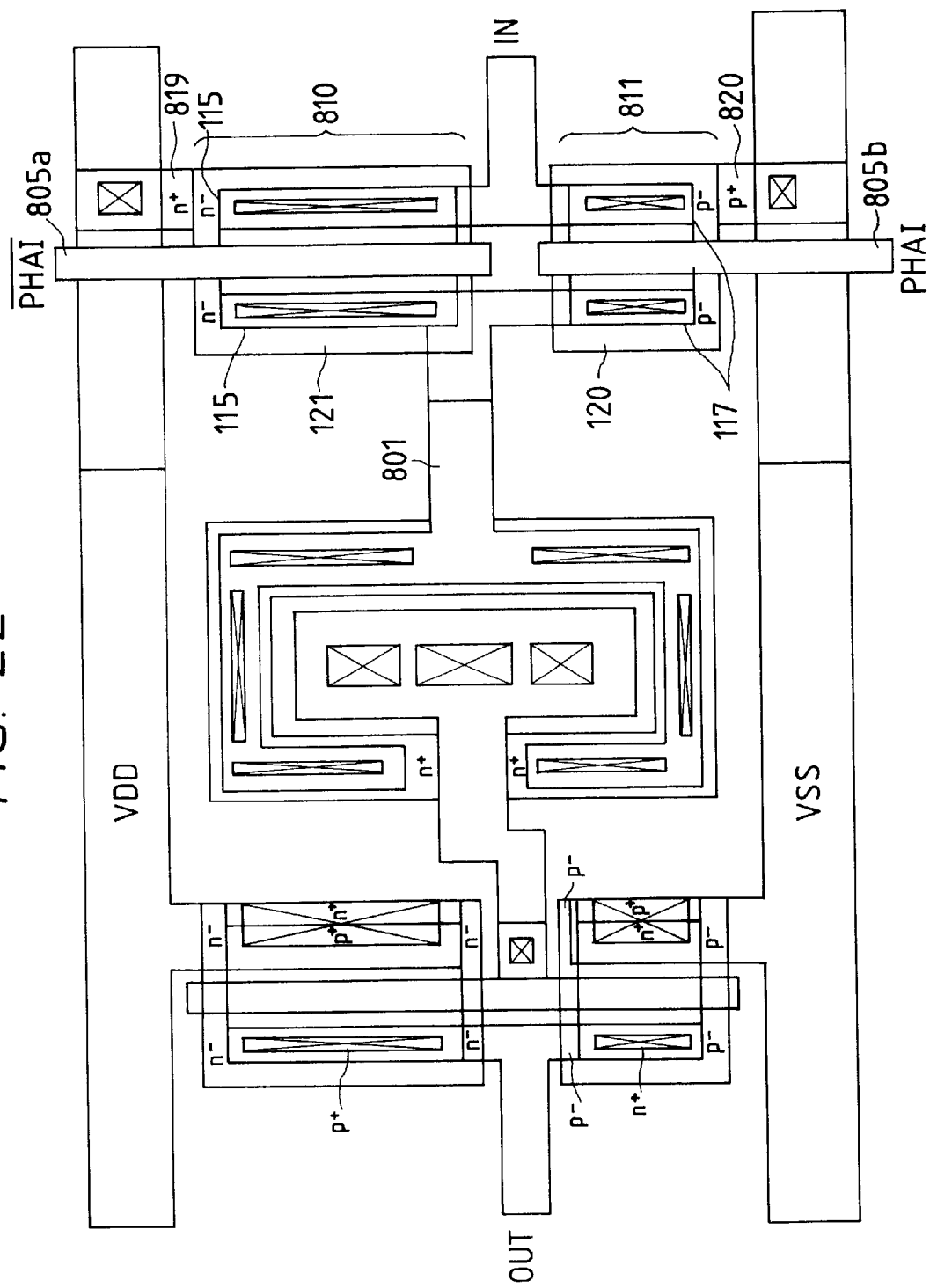

Referring to FIG. 22, a transmission gate is constituted by PMOS and NMOS transistors 810 and 811. One (source or drain) of the source and drain regions 115 or 117 of each transistor is commonly connected to the input terminal $Q_1$, and the remaining region is commonly connected to one electrode 801 of the capacitor. Since a gate electrode 805b of the NMOS transistor receives a signal PHAI for enabling/disabling the transmission gate, and a gate electrode 805a of the PMOS transistor receives a signal $\overline{PHAI}$, a signal of an identical level can be transferred from the input terminal $Q_1$ to the electrode 801 independently of the threshold value of the transistor, as is well known.

When the well potential must be fixed in the transmission gate, since the source and well need not be set at the same potential unlike in the inverter, the silicon region may be extended, as shown in, e.g., FIG. 22, so as to form high-concentration regions 819 and 820 having the same conductivity type as that of the well region, and these regions may be fixed by the power supply lines. This structure is a modification of FIG. 11 which is exemplified as an example of the method of forming the well contact structure.

This embodiment exemplifies an example of pattern formation used when the switch is added to "capacitor+sense amplifier" as the basic arrangement of the present invention. However, the form and position of the switch are not limited to the above-mentioned example. For example, a reset switch for resetting to a given potential may be arranged as the switch element in place of the transmission gate.

On the other hand, the switch may be arranged in the floating node. It is often effective to arrange, e.g., a reset switch for resetting to a given potential in the floating gate.

In the semiconductor device of the fourth embodiment, the following effects are expected.

(1) The transmission gate of this embodiment can perfectly isolate the input signal and the capacitor. In particular, when multiple input signals are simultaneously input at a given timing, since signals are simultaneously written by the transmission gates having a common gate, noise can be prevented from being mixed in the operation result, thus contributing to improvement of precision.

(2) When a reset gate is added as the switch means, a reset gate is arranged in the floating node, or these switches are combined, various operating functions can be realized. When these switches are realized on the SOI substrate which allows easy element isolation, a high-performance signal processing function can be realized by a relatively small area.

The above-mentioned semiconductor device can be used in a majority operating circuit. Such a majority operating circuit, and a correlation operating circuit using the same will be explained below.

Figure 23:
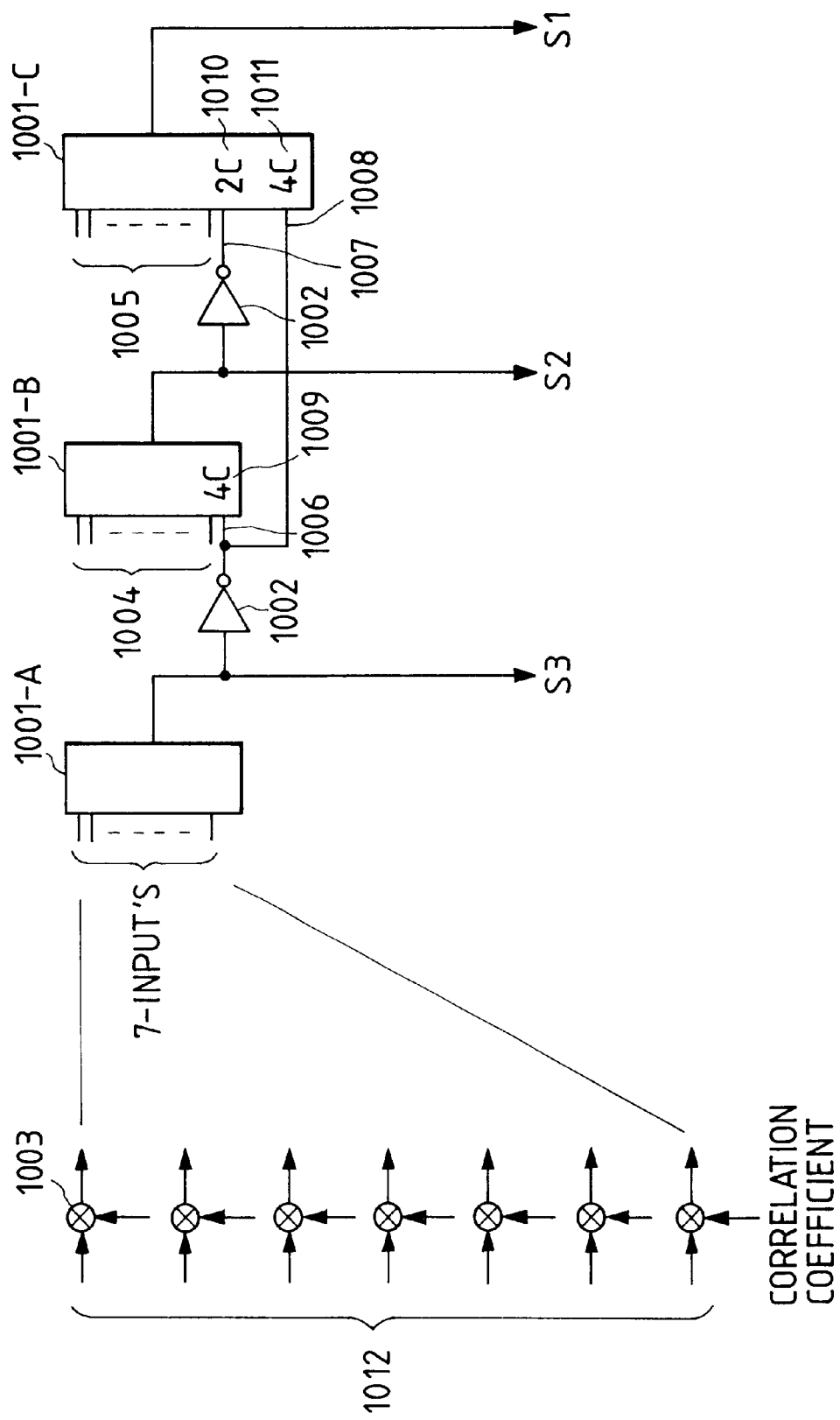
FIG. 23 is an explanatory view for explaining a correlation operating device.

FIG. 23 is an explanatory view which best illustrates a 7-input correlation operating device of the present invention. The circuit shown in FIG. 23 includes majority operating circuit blocks 1001-A, 1001-B, and 1001-C, inverters 1002, and comparators 1003. Terminals 1004 and 1005 receive signals similar to those input to input terminals 1012. Terminals 1006, 1007, and 1008 receive the output signals from the previous majority operating circuit blocks, and capacitance values 1009, 1010, and 1011 are connected in correspondence with the terminals 1006, 1007, and 1008 if the capacitance connected to a normal input terminal is represented by C.

Figure 24:
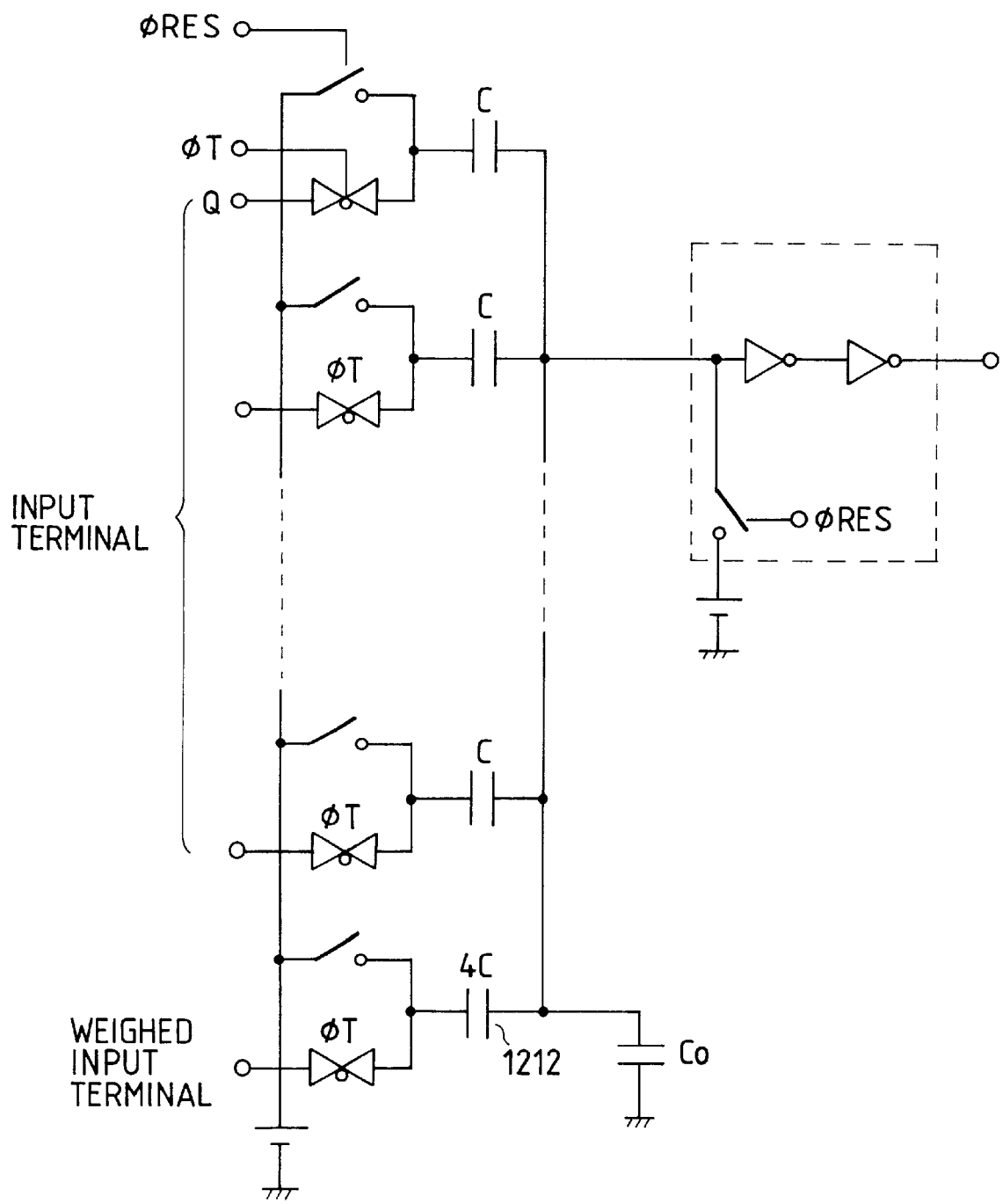
FIGS. 24 and 25 are equivalent circuit diagrams for explaining the circuit arrangement of an operating circuit.

Referring to FIG. 23, signals are input to the comparators 1003 together with correlation coefficients. Each comparator 1003 outputs a HIGH-LEVEL signal when the input signal coincides with the correlation coefficient; it outputs a LOW-LEVEL signal when the two inputs do not coincide with each other. The outputs from the comparators are input to the majority operating circuit block. When the outputs from the comparators 1003 are input to the 7-input majority operating circuit block 1001-A, and the number of HIGH-LEVEL signals is a majority, i.e., four out of seven inputs are HIGH-LEVEL signals, the majority operating circuit block outputs a HIGH-LEVEL signal. Similarly, for example, an 11-input majority operating circuit block outputs a HIGH-LEVEL signal when six inputs or more are HIGH-LEVEL signals, and a 13-input majority operating circuit block outputs a HIGH-LEVEL signal when seven inputs or more are HIGH-LEVEL signals. Column S3 of Table 1 below shows the output values of the 7-input majority operating circuit block in units of the numbers of HIGH-LEVEL signals. Then, as shown in FIG. 23, the output from the 7-input majority operating circuit block is inverted by the inverter, and the inverted output is supplied to the weighted input terminal of the majority operating circuit block 1001-B. FIG. 24 shows the circuit arrangement of the majority operating circuit block 1001-B. Referring to FIG. 24, a capacitor 1212 has a capacitance value about four times those of capacitors 1202 connected to other input terminal routes. The circuit shown in FIG. 24 can be considered as a 11-input majority operating circuit. In this circuit, if the capacitance value connected to the input terminal route is represented by C, 11 "C"s are commonly connected, four out of 11 "C"s receive the signal from the weighted input terminal, and the remaining seven terminals receive the same signals as those input to the block 1001-A. For example, when four or more out of the seven inputs to the first operating circuits are HIGH-LEVEL signals, a LOW-LEVEL signal is applied to the weighted input terminal of the next operating circuit, as described above. In this case, furthermore, when six or more out of seven input signals supplied to the input terminals other than the weighted input terminals of the next operating circuit are HIGH-LEVEL signals, the 11-input majority operating circuit determines a majority in total, and outputs HIGH-LEVEL signals. When four or more and five or less out of seven inputs are HIGH-LEVEL signals, the circuit outputs a LOW-LEVEL signal since a majority is not determined. On the other hand, when three or less out of the seven inputs to the first operating circuits are HIGH-LEVEL signals, a HIGH-LEVEL signal is applied to the weighted input terminal. In this case, when two or more and three or less out of seven inputs to the next operating circuits are HIGH-LEVEL signals, since 4+2 or 4+3 is equal to or larger than 6, and a majority is determined, a HIGH-LEVEL signal is output. On the other hand, when one or less out of seven inputs is a HIGH-LEVEL signal, since 4+0 or 4+1 is smaller than 6, a LOW-LEVEL signal is output.

Column S2 of Table 1 below shows the output values of the majority operating circuit block 1001-B in units of the numbers of input HIGH-LEVEL signals. As for the majority operating circuit block 1001-C, when the inverted signals of the outputs from the majority operating circuit blocks 1001-A and 1001-B are applied to two weighted input terminals respectively having ×4 and ×2 capacitance values, the outputs shown in column S1 in Table 1 below can be obtained. With this circuit arrangement, the number of inputs, which coincide with the corresponding correlation coefficients, of a plurality of inputs can be converted into a 3-digit binary value, and the converted value can be output.

TABLE 1

| Input | S3 | S2 | S1 |
|---|---|---|---|
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

Figure 25:
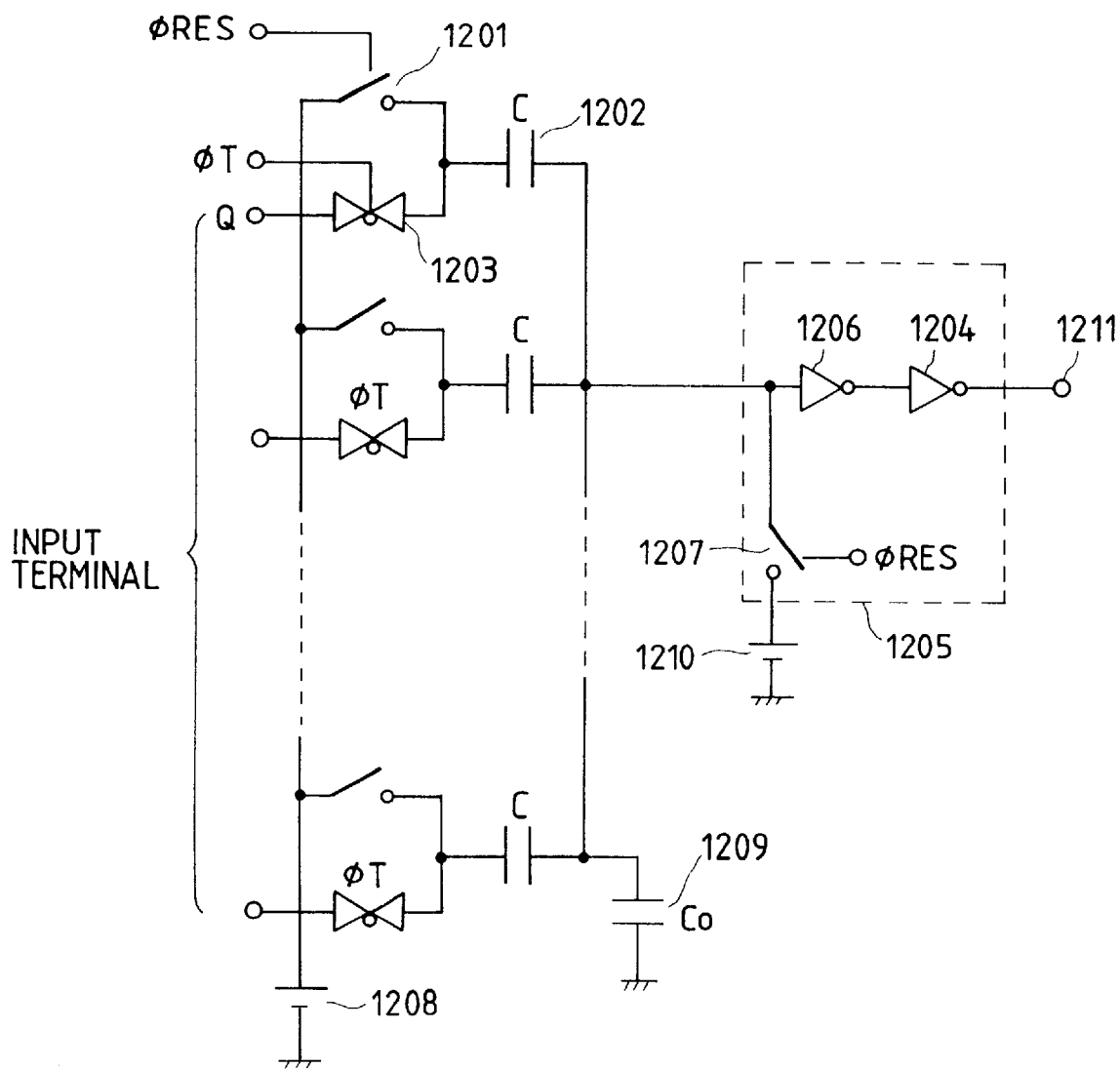

FIG. 25 is a circuit diagram of the majority operating circuit block. Referring to FIG. 25, the circuit comprises reset switches 1201, capacitors 1202, signal transfer switches 1203, a sense amplifier 1205, an inverter 1206 in the sense amplifier, a second inverter 1204 in the sense amplifier, a second reset switch 1207 for resetting the inverters, a reset power supply 1208, a second reset power supply 1210, an output terminal 1211, and a parasitic capacitance 1209 which is connected to commonly connected one-terminal portions of the capacitors 1202.

FIGS. 26A to 26C are timing charts of the circuit shown in FIG. 25. The operation of the circuit shown in FIG. 25 will be described below with reference to FIGS. 26A to 26C. One terminal of each capacitor 1202 is reset by a reset pulse φRES. The reset voltage to be used is 2.5 V half that of the power supply voltage if it is a 5-V system. Note that the reset voltage is not limited to this, and other voltages may be used. At this time, the input terminal of the inverter 1206 in the sense amplifier is reset at substantially the same time by enabling the reset switch 1207. The reset voltage at that time is selected to have a value near a logic inversion voltage at which the output from the inverter is inverted. When the reset pulse φRES is turned off, the two terminals of each capacitor 1202 are held at the corresponding reset potentials. When each transfer switch 1203 is enabled by a transfer pulse φT, a signal is transferred to one terminal of each capacitor 1202, and the potential at one terminal of the capacitor changes from the reset voltage of, e.g., 2.5 V to 0 V corresponding to LOW LEVEL or 5 V corresponding to HIGH LEVEL. Let C be the capacitance of each capacitor 1202, and $C_0$ be the capacitance value of the parasitic capacitance. If N capacitors 1202 are connected in parallel with each other, the potential at the commonly connected terminals of the capacitors 1202 changes for a single input by capacitance division from a voltage in the neighborhood of the logic inversion voltage of the inverter by:

$$\pm \frac{C \times 2.5}{C_0 + N \times C}[V]$$

When the input terminal voltage of the inverter 1206 changes from the logic inversion voltage, the output terminal voltage of the inverter 1206 is inverted accordingly. When signals are input to N input terminals, a sum of N capacitance division outputs is input to the input terminal of the inverter 1206. As a result, if the number of HIGH-LEVEL signals of the N inputs is a majority, the input terminal of the inverter 1206 shifts to a potential higher than the logic inversion voltage, and a HIGH-LEVEL signal is output from the output terminal 1211 of the sense amplifier. On the other hand, when the number of LOW-LEVEL signals is a majority, a LOW-LEVEL signal is output. With the above-mentioned arrangement, the circuit shown in FIG. 25 serves as a majority operating circuit for outputting a logic value corresponding to the majority of a plurality of inputs.

FIG. 23 exemplifies a 7-input correlation operating circuit. However, the present invention is not limited to this, and the number of inputs can be easily increased. If necessary, the number of inputs may be decreased.

An analog-to-digital converter having the majority operating circuit using the present invention will be described below. FIG. 27 is a circuit diagram of a 3-bit precision analog-to-digital converter (to be referred to as an A/D converter hereinafter) according to the present invention. Referring to FIG. 27, the converter includes 1-, 2-, and 3-input operating circuit blocks 2001-A, 2001-B, and 2001-C, and inverters 2002. Terminals 2003, 2004, and 2005 receive output signals from the previous majority operating circuit blocks. Capacitance values 2006, 2007, and 2008 are connected in correspondence with the terminals 2003, 2004, and 2005 if the capacitance connected to a normal input terminal is represented by C. An analog signal input terminal 2009 is connected to the blocks 2001-A to 2001-C. The blocks 2001-B and 2001-C have set input terminals 2010, and capacitance values 2011 and 2012 are connected in correspondence with these terminals 2010. A case will be exemplified below wherein a power supply of 5 V is used. Referring to FIG. 27, the sense amplifier input in the operating circuit block 2001-A is reset to 0 V, and the sense amplifier inputs in the operating circuit blocks 2001-B and 2001-C are reset to about 2.5 V. The signal input terminals 2003, 2004, and 2005, and the set input terminals 2010 are reset to 5 V. At this time, the signal input terminal 2009 is at 0 V. Then, the set input terminals 2010 are set at 0 V, and the input is changed from 0 V to an analog signal voltage. In the block 2001-A, when the analog input signal becomes equal to or higher than 2.5 V, the sense amplifier input potential in the operating circuit block exceeds a logic inversion voltage (assumed to be 2.5 V), and a HIGH-LEVEL signal is output. Column S3 in Table 2 below shows the output results. When the analog input signal is equal to or higher than 2.5 V, the input terminal 2003 changes from the reset potential of 5 V to 0 V. At this time, the potential change at the sense amplifier input terminal in the operating circuit block is given by:

$$\frac{C \cdot VA - (C/2) \cdot 5 - (C/4) \cdot 5}{C + (C/2) + (C/4)}$$

where VA is the analog input signal voltage.

As can be seen from this formula, the operating circuit block 2001-B outputs HIGH-LEVEL signal when the analog signal voltage VA is equal to or higher than 3.75 V, and outputs a LOW-LEVEL signal when the voltage VA is equal to or higher than 2.5 V and is less than 3.75 V. Column S2 in Table 2 below shows the output results. Similarly, column S1 of Table 2 below shows the outputs from the operating circuit block 2001-C. With this arrangement, as shown in FIG. 2, the A/D converter which converts an analog signal voltage into a 3-bit digital signal, and outputs the digital signal can be realized as one having a small circuit scale, high operation speed, and low consumption power.

TABLE 2

| Analog Input Voltage | S3 | S2 | S1 |
| --- | --- | --- | --- |
| $0.0 \leq VA < 0.625$ | 0 | 0 | 0 |
| $0.625 \leq VA < 1.25$ | 0 | 0 | 1 |
| $1.25 \leq VA < 1.875$ | 0 | 1 | 0 |
| $1.875 \leq VA < 2.5$ | 0 | 1 | 1 |
| $2.5 \leq VA < 3.125$ | 1 | 0 | 0 |
| $3.125 \leq VA < 3.75$ | 1 | 0 | 1 |
| $3.75 \leq VA < 4.375$ | 1 | 1 | 0 |
| $4.375 \leq VA < 5.0$ | 1 | 1 | 1 |

In this embodiment, the 3-bit A/D converter has been described. However, the present invention is not limited to this, as a matter of course, and the number of bits can be easily increased.

In this embodiment, a flash type A/D converter using capacitors has been exemplified. However, the present invention is not limited to this. For example, the present invention may be applied to an encoder circuit section of an A/D converter which performs A/D conversion in such a manner that comparators compare signals input to a resistor array and a reference signal, and an encoder encodes the comparison results, thus obtaining the same effects as described above.

As described above, in the circuit block in which the terminals on one side of the capacitor corresponding to multiple input terminals are commonly connected to the input of the sense amplifier, when the minimum one of capacitances connected to the multiple input terminals is represented by C, the total of the capacitances of the capacitor is roughly an odd multiple of C.

When a correlation circuit has no control input terminal, all the capacitances connected to the input terminals have a minimum value. On the other hand, when the correlation circuit has control input terminals, as has been described above with reference to, e.g., FIG. 23, the capacitances connected to the control input terminals are even multiples of C like 2C and 4C, and a total of the capacitances of these terminals and an odd number of input signal terminals is roughly an odd multiple of C. With this arrangement, comparison with a desired reference value can be clearly attained, thus improving operation precision.

In the above description, the correlation circuit has been exemplified. In the case of a binary D/A converter, if the signal input capacitance of the least significant bit (LSB) is represented by C, the capacitance of the next bit is 2C, that of the still next bit is 4C, and the like, i.e., the capacitance of each bit assumes a value twice as large as the immediately preceding bit, and a total of capacitances of multiple input terminals becomes exactly or roughly an odd multiple of C, thus realizing a high-precision D/A converter.

In the A/D converter, as has been described above with reference to FIG. 27, the number of division places in the block 2001-A is set to be one (1C) to clearly discriminate if the analog signal level is larger than or less than ½ of the full range. On the other hand, in the block 2001-B, the number of division places is set to be 3, i.e., an odd number, to discriminate if the analog signal level is larger than or less than ¼, ²⁄₄, and ¾ (in Table 2, a place between "0" and "1" in the second and third rows from the uppermost row, a place between "1" and "0" in the fourth and fifth rows, and a place between "0" and "1" in the sixth and seventh rows) of the full range, and its total assumes an odd multiple value, i.e., 1+2+4=7 to have C/4 as a minimum value. Similarly, the block 2001-C is set to have C/8 (minimum value), C/4, C/2, and C which are twice as large as the immediately preceding values, i.e., an odd multiple value 1+2+4+8=15.

With this arrangement, since high-precision arithmetic operations can be attained without requiring any unnecessarily large capacitances, low consumption power, and high-speed arithmetic operations can be realized.

In the above description, the correlation operating device and the A/D converter have been exemplified. However, the present invention is not limited to these units. For example, the present invention may be applied to various other logic circuits such as a digital-to-analog converter, an adder, a subtracter, and the like, thus obtaining the same effects as described above.

Especially, when the present invention is applied to a D/A converter, if the capacitance of the input terminal for receiving LSB data is represented by C, the capacitances need only be set to be twice as large as the immediately preceding value toward the most significant bit like 2C, 4C, 8C, . . . , thus realizing a binary D/A converter. In this case, the outputs from the commonly connected terminals of the capacitors can be received by a source floor amplifier.

Figure 28:
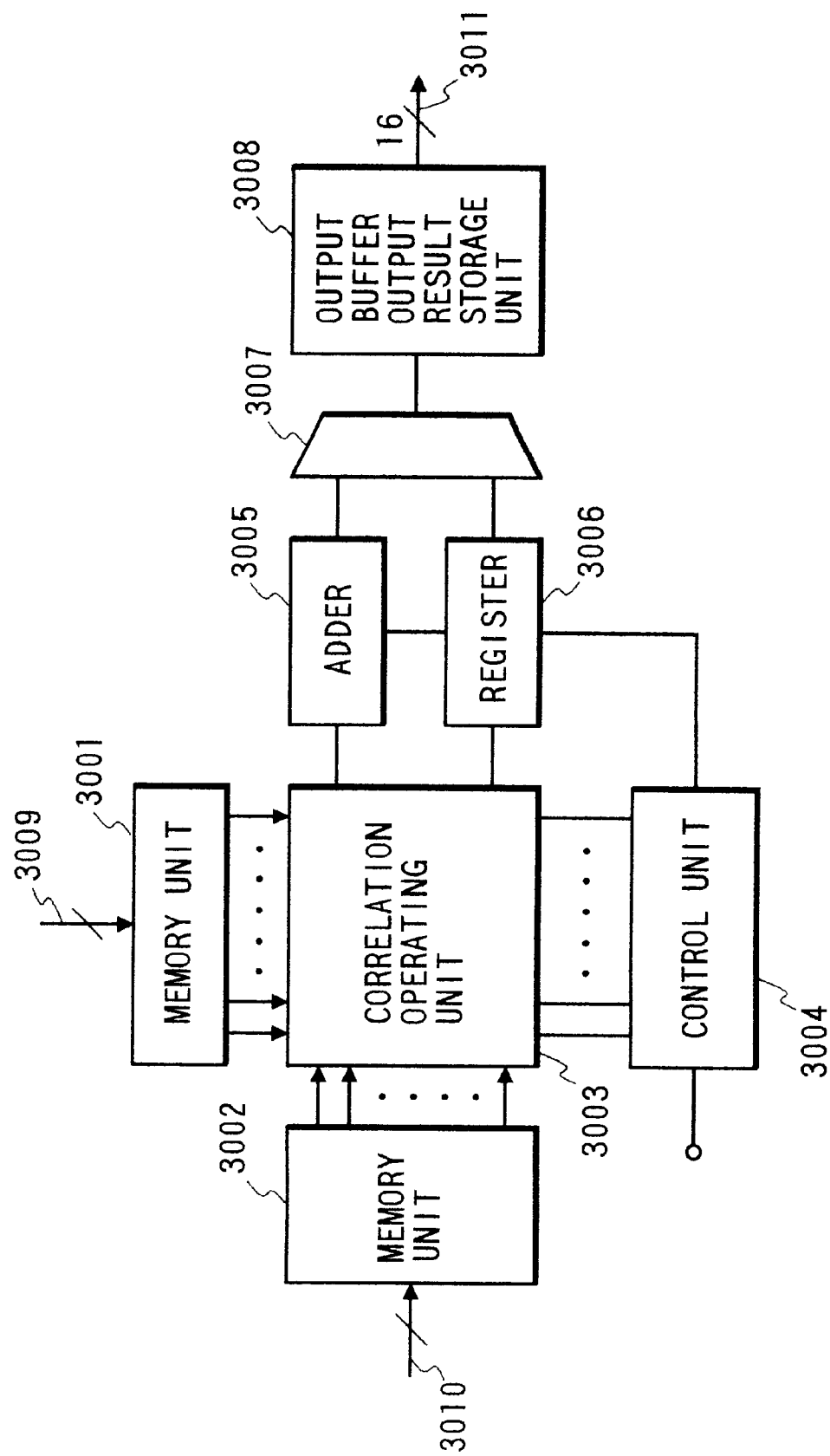
FIG. 28 is a schematic block diagram of a device using a correlation operating device.

FIG. 28 is a schematic block diagram of an apparatus using the above-mentioned correlation operating device. This apparatus realizes a motion detection chip upon combination of the technique of the present invention and the conventional circuit technique. Referring to FIG. 28, the apparatus includes memory units 3001 and 3002 for respectively storing reference data and comparison data, a correlation operating unit 3003, a control unit 3004 for controlling the entire chip, an adder 3005 for adding the correlation results, a register 3006 for holding the minimum value of the sums from the adder 3005, a unit 3007 serving as a comparator and a unit for storing the address of the minimum value, and a unit 3008 serving as an output buffer and an output result storage unit. A terminal 3009 receives a reference data string, and a terminal 3010 receives a comparison data string to be compared with the reference data string. The memory units 3001 and 3002 comprise, e.g., SRAMs, and are constituted by conventional CMOS circuits. Data supplied to the correlation operating unit 3003 can be processed by parallel processing since the unit 3003 comprises a correlation operating device of the present invention. For this reason, the unit 3003 can not only attain very high-speed processing, but also be constituted by a smaller number of elements, thus reducing the chip size and cost. The correlation arithmetic operation result is scored (evaluated) by the adder 3005, and is compared with the contents of the register 3006 which stores the maximum correlation arithmetic operation result (minimum sum) before the current correlation arithmetic operation by the unit 3007. If the current arithmetic operation result is smaller than the previous minimum value, the current result is newly stored in the register 3006; if the previous result is smaller than the current result, the previous result is maintained. With this operation, the maximum correlation arithmetic operation result is always stored in the register 3006, and upon completion of the operation of all the data strings, the final correlation result is output from a terminal 3011. The units 3004, 3005, 3006, 3007, and 3008 are constituted by conventional CMOS circuit in this apparatus. In particular, when the adder 3005 adopts the circuit arrangement of the present invention, parallel addition can be realized, thus realizing high-speed processing. As has been described above, not only high-speed processing and low cost are realized but also the consumption current can be reduced since the arithmetic operations are executed on the basis of capacitances, thus realizing low consumption power. For this reason, the present invention is suitably applied to a portable equipment such as an 8-mm VTR camera or the like.

A case will be explained below with reference to FIGS. 29 to 31 wherein high-speed image processing is executed before image data is read out upon combination of the above-mentioned correlation operating device and an optical sensor (solid-state image pickup element).

Figure 29:
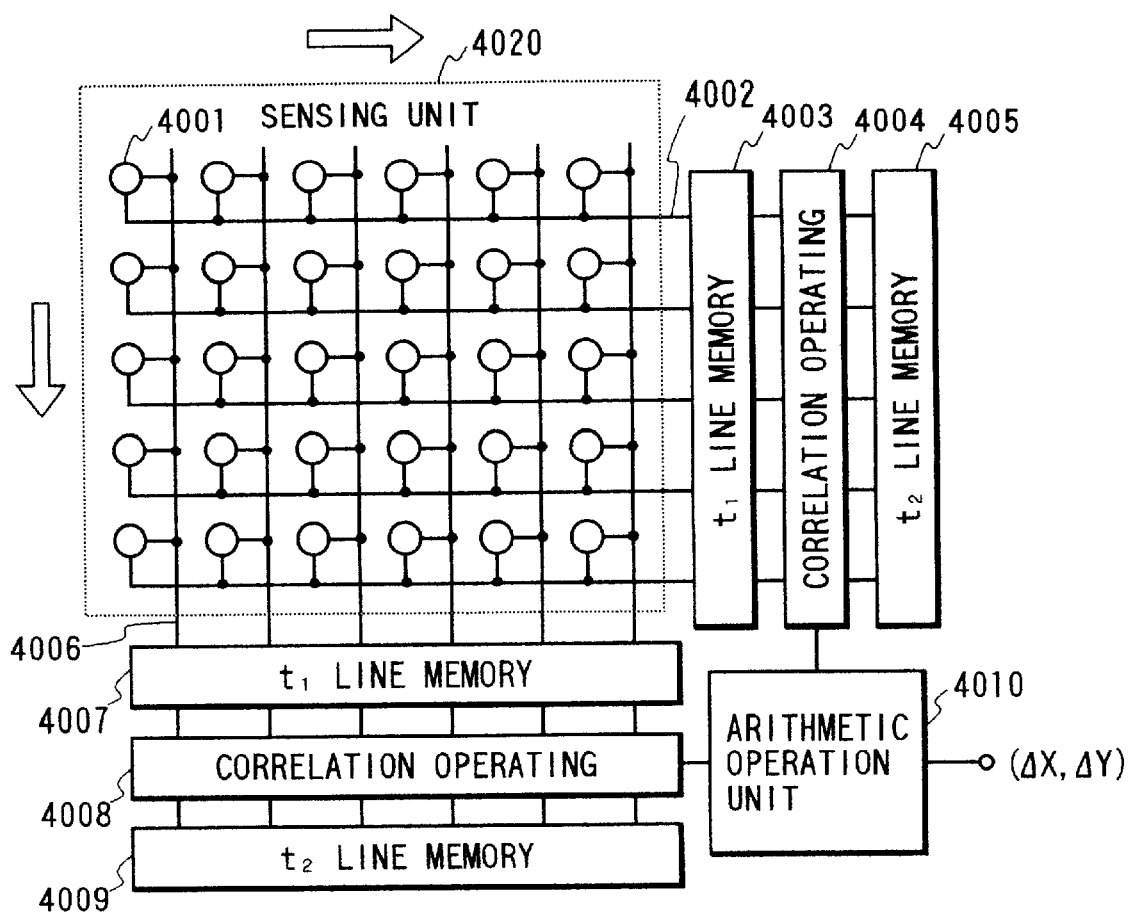
FIG. 29 is a diagram showing an example of the arrangement of the overall chip as a semiconductor device of the present invention.
Figure 30:
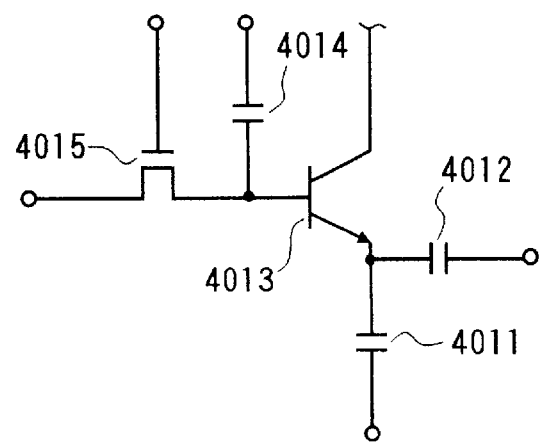
FIG. 30 is an equivalent circuit diagram for explaining the arrangement of a pixel portion of the chip.
Figure 31:
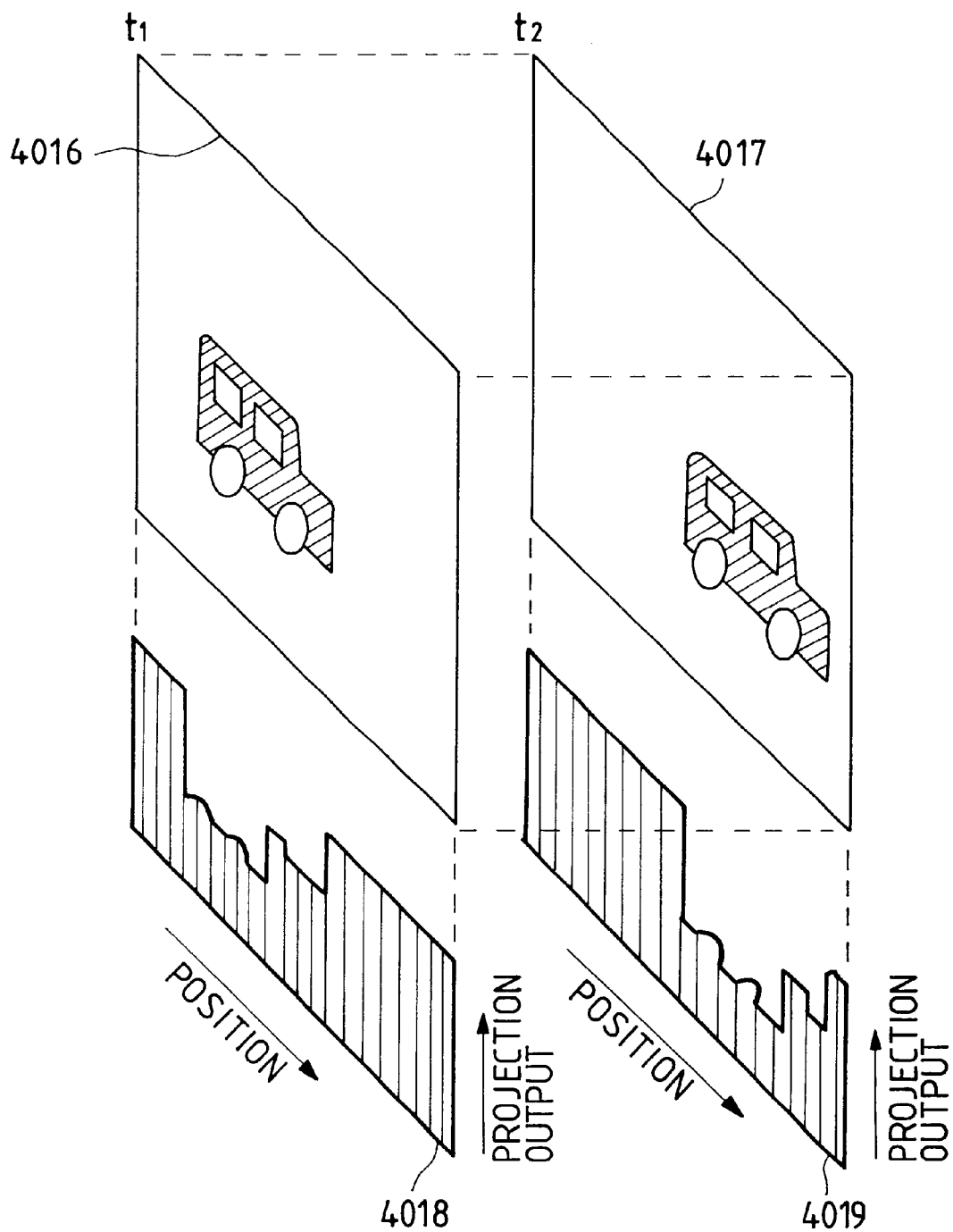
FIG. 31 is an explanatory view for explaining the arithmetic operation contents.

FIG. 29 is a diagram showing the arrangement of the overall chip of the present invention, FIG. 30 is an equivalent circuit diagram for explaining the arrangement of a pixel portion of the chip of the present invention, and FIG. 31 is an explanatory view for explaining the arithmetic operation contents of the chip of the present invention.

Referring to FIG. 29, the chip includes light-receiving portions 4001, memory units 4003, 4005, 4007, and 4009, correlation operating units 4004 and 4008, and an arithmetic operation unit 4010. Referring to FIG. 30, each pixel portion includes capacitor 4011 and 4012 for respectively connecting optical signal output terminals and output bus lines 4002 and 4006, and an optical sensor (to be referred to as a bipolar transistor hereinafter) 4013 constituted by a bipolar transistor. The pixel portion also includes a capacitor 4014 connected to the base region of the bipolar transistor, and a switch transistor 4015. Image data input to an image data sensing unit 4020 is photoelectrically converted by the base region of the bipolar transistor 4013.

An output corresponding to the photoelectrically converted photocarriers is read out to the emitter of the bipolar transistor 4013, and raises the output bus line potentials in correspondence with the signal via the capacitor 4011 and 4012. With the above-mentioned operation, the sum of the outputs from the pixels in the column direction is read out to the memory unit 4007, and the sum of the outputs from the pixels in the row direction is read out to the memory unit 4003. In this case, if a region where the base potential of the bipolar transistor is raised via the capacitor 4014 of each pixel portion is selected using, e.g., a decoder (not shown in FIGS. 29 and 30), the sums in the X- and Y-directions of an arbitrary region on the sensing unit 4020 can be output.

For example, as shown in FIG. 31, when an image 4016 is input at time $t_1$, and an image 4017 is input at time $t_2$, output results 4018 and 4019 obtained by respectively adding these images in the Y-direction are obtained, and these data are respectively stored in the memory units 4007 and 4009 shown in FIG. 29. In FIG. 29, the photoelectric conversion signals from the sensing unit 4020 are input to the $t_1$ line memory units 4003 and 4007, and correlation arithmetic operations are performed between the data stored in the memory units 4003 and 4007, and data stored in the $t_2$ line memory units 4005 and 4009, respectively. Alternatively, switch means may be arranged to perform a switching operation for inputting the photoelectric conversion signals from the sensing unit 4020 to the $t_2$ line memory units 4005 and 4006, and these data may be subjected to correlation arithmetic operations with the data stored in the $t_1$ line memory units 4003 and 4007.

As can be seen from the output results 4018 and 4019 shown in FIG. 31, the data of the two images shift in correspondence with the motion of the image. Thus, when the correlation operating unit 4008 calculates the shift amount, the motion of an object on the two-dimensional plane can be detected by a very simple method.

The correlation operating units 4004 and 4008 shown in FIG. 29 can comprise the correlation operating circuit of the present invention. Each of these units has a smaller number of elements than the conventional circuit, and, in particular, can be at the sensor pixel pitch. This arrangement performs arithmetic operations on the basis of analog signals output from the sensor. However, when the A/D converter of the present invention is arranged between each memory unit and the output bus line, a digital correlation arithmetic operation can be realized, needless to say.

The sensor of the present invention comprises a bipolar transistor. However, the present invention is also effective for a MOS transistor or only a photodiode without arranging any amplification transistor.

Furthermore, the above-mentioned arrangement performs a correlation arithmetic operation between data strings at different times. Alternatively, when X- and Y-projection results of a plurality of pattern data to be recognized are stored in one memory, pattern recognition can also be realized.

As described above, when the pixel input unit and the circuit of the present invention are combined, the following effects are expected.

1. Since data which are parallelly and simultaneously read out from the sensor are subjected to parallel processing unlike in the conventional processing for serially reading out data from the sensor, high-speed motion detection and pattern recognition processing can be realized.

2. Since image processing can be realized by one sensor chip without increasing the size of peripheral circuits, the following high-grade function products can be realized with low cost:

(1) control for turning the TV screen toward the user direction (2) control for turning the wind direction of an air conditioner toward the user direction (3) tracing control of an 8-mm VTR camera (4) label recognition in a factory (5) manufacture of a reception robot that can automatically recognize a person (6) manufacture of an inter-vehicle distance controller for a vehicle The combination of the image input unit and the circuit of the present invention has been described. The present invention is effective not only for image data but also for, e.g., recognition processing of audio data.

As described above, according to the present invention, the following effects are expected.

(1) Since multiple input signals are supplied to one floating node via capacitor, and a signal output from the floating node is detected by a sense amplifier, a semiconductor device, which can prevent an increase in circuit scale upon an increase in the number of bits and hence, can reduce cost, can be provided. Even when the number of inputs (the number of bits) increases, since the number of times of logic operations does not increase, a semiconductor device which can perform an arithmetic operation at higher speed than a conventional device can be provided.

(2) Since a simple arrangement and small-area isolation unique to an SOI substrate can be realized, a semiconductor device which can perform an arithmetic operation with higher precision can be provided even using the same working technique.

(3) A multi-bit correlation operating device, A/D converter, and majority logic circuit, which cannot be conventionally realized due to too high a cost can be provided with a practical low cost.

Note that the present invention is not limited to the above embodiments, and appropriate modifications and combinations may be made within the scope of the invention.

As the sense amplifier in the present invention, one normally used in the semiconductor field can be used. For example, a sense amplifier which can be used in the field of memories can be used.

In addition, the drawings used for the purpose of explanation are schematic explanatory ones, and some members on the drawings (e.g., an insulating interlayer on the plan view) are omitted for avoiding the complexity of the drawings. Also, the shapes of some members (e.g., an electrode shape) are modified. Furthermore, in the plan view, members are indicated by solid lines disregarding their vertical positional relationship so as to avoid the complexity of the drawings.

What is claimed is:

1. A semiconductor device comprising:

a plurality of input terminals capable of inputting signals independently of each other;

a capacitor that includes a plurality of capacitor elements each with two opposed electrodes, a first of the two electrodes being electrically connected to one of the plurality of input terminals for weighting in an arithmetic operation; and a sense amplifier that includes an input section commonly connected to a second of the two electrodes of the plurality of capacitor elements, wherein said sense amplifier outputs a result of the arithmetic operation, said capacitor is disposed on an insulating surface such that the first electrode is disposed on the insulating surface and the second electrode is disposed on the first electrode to sandwich an insulating layer therebetween, said sense amplifier comprises a field effect transistor that includes a semiconductor film, and said sense amplifier is provided on the insulating surface and is used in performing the arithmetic operation;

a switch element connected to at least one of the two opposed electrodes of each of the plurality of capacitor elements, said switch element including a field effect transistor, wherein said field effect transistor includes source and drain regions and a well region of a first conductivity type, the first conductivity type being opposite to a second conductivity type; and around the source and drain regions, a region of the first conductivity type and of an impurity concentration lower than that of the well region.

* * * * *

UNITED STATES PATENT AND TRADEMARK OFFICE
CERTIFICATE OF CORRECTION

PATENT NO.   : 6,407,442 B2
DATED        : June 18, 2002
INVENTOR(S)  : Shunsuke Inoue et al.

It is certified that error appears in the above-identified patent and that said Letters Patent is hereby corrected as shown below:

Column 2,
Line 1, "capacitor" should read -- capacitors --.

Column 4,
Line 16, "in" should read -- n --.

Column 7,
Line 53, "signal," should read -- signal --.

Column 13,
Line 36, "2.5 V" should read -- 2.5 V, --.

Signed and Sealed this

Fourth Day of March, 2003

JAMES E. ROGAN
*Director of the United States Patent and Trademark Office*